(12) United States Patent
Schenk et al.

(10) Patent No.: US 10,965,360 B2
(45) Date of Patent: *Mar. 30, 2021

(54) METHODS AND APPARATUS RELATED TO BEAM REFINEMENT

(71) Applicant: QUALCOMM Incorporated, San Diego, CA (US)

(72) Inventors: Andreas Maximilian Schenk, Erlangen (DE); Michael Paul Cyran, Nuremberg (DE); Christoph Joetten, Wadern (DE); Hendrik Schoeneich, Lauf a.d. Pegnitz (DE); Assaf Touboul, Netanya (IL); Ran Berliner, Kfar-Aviv (IL); Shay Landis, Hod Hasharon (IL)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/043,036

(22) Filed: Jul. 23, 2018

(65) Prior Publication Data

US 2019/0068270 A1    Feb. 28, 2019

Related U.S. Application Data

(60) Provisional application No. 62/549,393, filed on Aug. 23, 2017.

(51) Int. Cl.
*H04B 7/06* (2006.01)
*H04B 7/08* (2006.01)
(Continued)

(52) U.S. Cl.
CPC ...... *H04B 7/0695* (2013.01); *H03M 13/1125* (2013.01); *H03M 13/3769* (2013.01);
(Continued)

(58) Field of Classification Search
CPC .... H04B 7/0695; H04B 7/0408; H04B 7/043; H04B 7/0639; H03M 13/1125
See application file for complete search history.

(56) References Cited

U.S. PATENT DOCUMENTS 8,588,347 B1 * 11/2013 Petrovic ............... H04L 1/0052
                                                                    375/340
9,819,083 B1 * 11/2017 Chen ..................... H01Q 3/40
(Continued)

FOREIGN PATENT DOCUMENTS

WO    WO-2016186347 A1 * 11/2016 ............. H04J 11/00
WO       2016210302 A1    12/2016
(Continued)

OTHER PUBLICATIONS

International Search Report and Written Opinion—PCT/US2018/043561—ISA/EPO—dated Oct. 26, 2018.

*Primary Examiner* — Berhanu Tadese
(74) *Attorney, Agent, or Firm* — Arent Fox, LLP

(57) ABSTRACT

In an aspect of the disclosure, a method, a computer-readable medium, and an apparatus are provided. The apparatus may be a UE configured to receive a plurality of beams through a plurality of different receive beam directions, each of the beams including broadcast information on a PBCH. The apparatus may be further configured to determine, for each of a subset of the received beams, a log likelihood ratio (LLR) for coded bits of the broadcast information. The apparatus may be further configured to decode the broadcast information associated with each of the subset of the received beams, and determine a refined receive beam direction based on the determined LLRs and based on whether the broadcast information associated with each of the subset of the received beams fails to decode or is successfully decoded.

29 Claims, 10 Drawing Sheets

(51) Int. Cl.
  *H03M 13/37*  (2006.01)
  *H03M 13/00*  (2006.01)
  *H03M 13/11*  (2006.01)
  *H04B 7/0408* (2017.01)
  *H04B 7/0426* (2017.01)

(52) U.S. Cl.
  CPC ......... *H03M 13/612* (2013.01); *H03M 13/63* (2013.01); *H04B 7/043* (2013.01); *H04B 7/0408* (2013.01); *H04B 7/0639* (2013.01); *H04B 7/088* (2013.01); *H04B 7/0885* (2013.01)

(56) References Cited

U.S. PATENT DOCUMENTS

| | | | | |
|---|---|---|---|---|
| 10,419,199 | B2* | 9/2019 | Ly | H04W 56/00 |
| 2005/0206564 | A1* | 9/2005 | Mao | H01Q 3/2605 342/377 |
| 2009/0135944 | A1* | 5/2009 | Dyer | H04L 25/0248 375/267 |
| 2010/0088575 | A1* | 4/2010 | Sharon | H03M 13/6591 714/763 |
| 2010/0183101 | A1* | 7/2010 | Mundarath | H04L 1/0048 375/341 |
| 2011/0026645 | A1* | 2/2011 | Luo | H04L 1/0038 375/340 |
| 2011/0164707 | A1* | 7/2011 | Luo | H04L 1/0045 375/341 |
| 2011/0190024 | A1* | 8/2011 | Seong | H04W 52/322 455/522 |
| 2011/0228883 | A1* | 9/2011 | Liu | H04L 1/0045 375/341 |
| 2012/0020310 | A1* | 1/2012 | Ji | H04L 1/1867 370/329 |
| 2012/0122472 | A1* | 5/2012 | Krishnamurthy | H04L 27/0012 455/456.1 |
| 2012/0307691 | A1* | 12/2012 | Wang | H04L 25/03171 370/280 |
| 2012/0320874 | A1* | 12/2012 | Li | H04W 48/12 370/331 |
| 2013/0124947 | A1* | 5/2013 | Lane | H03M 13/4176 714/786 |
| 2013/0173990 | A1* | 7/2013 | Li | H03M 13/373 714/763 |
| 2013/0182688 | A1* | 7/2013 | Damnjanovic | H04L 5/001 370/336 |
| 2014/0098912 | A1* | 4/2014 | Yin | H04B 7/088 375/345 |
| 2014/0327559 | A1* | 11/2014 | Xu | H04L 1/0048 341/107 |
| 2015/0085840 | A1* | 3/2015 | Liu | H04L 1/1887 370/336 |
| 2015/0181575 | A1* | 6/2015 | Ng | H04W 72/042 370/329 |
| 2015/0280802 | A1 | 10/2015 | Thomas et al. | |
| 2015/0289147 | A1* | 10/2015 | Lou | H04B 7/0452 370/329 |
| 2016/0029358 | A1* | 1/2016 | Hou | H04W 74/0833 370/329 |
| 2016/0157267 | A1* | 6/2016 | Frenne | H04B 7/0408 370/329 |
| 2016/0227345 | A1* | 8/2016 | Xu | H04L 5/0053 |
| 2016/0227583 | A1* | 8/2016 | Chavva | H04L 5/14 |
| 2016/0308637 | A1* | 10/2016 | Frenne | H04J 11/0069 |
| 2016/0373180 | A1* | 12/2016 | Guo | H04B 7/0695 |
| 2017/0006593 | A1* | 1/2017 | Liu | H04W 24/10 |
| 2017/0041051 | A1* | 2/2017 | Rahman | H04B 7/0482 |
| 2017/0104517 | A1* | 4/2017 | Kakishima | H04B 7/0697 |
| 2017/0105112 | A1* | 4/2017 | Park | H04W 8/005 |
| 2017/0118665 | A1* | 4/2017 | Park | H04B 7/0626 |
| 2017/0187488 | A1* | 6/2017 | Rico Alvarino | H03M 13/09 |
| 2017/0194988 | A1* | 7/2017 | Li | H03M 13/45 |
| 2017/0201898 | A1* | 7/2017 | Park | H04L 5/0048 |
| 2017/0207884 | A1* | 7/2017 | Jiang | H04L 1/1845 |
| 2017/0222771 | A1* | 8/2017 | Chendamarai Kannan | H04L 5/0048 |
| 2017/0250831 | A1* | 8/2017 | Aldana | H04W 4/02 |
| 2017/0279561 | A1* | 9/2017 | Nakamura | H04L 27/0008 |
| 2017/0303136 | A1* | 10/2017 | Park | H04B 17/102 |
| 2017/0303263 | A1* | 10/2017 | Islam | H04B 7/0626 |
| 2017/0311276 | A1* | 10/2017 | Tsai | H04L 27/2602 |
| 2017/0311332 | A1* | 10/2017 | Hong | H04J 11/004 |
| 2017/0318478 | A1* | 11/2017 | Basu Mallick | H04L 5/0091 |
| 2017/0331577 | A1* | 11/2017 | Parkvall | H04J 11/0079 |
| 2017/0331613 | A1* | 11/2017 | Ly | H04L 5/0048 |
| 2017/0331670 | A1* | 11/2017 | Parkvall | H04W 24/10 |
| 2017/0332359 | A1* | 11/2017 | Tsai | H04B 7/0639 |
| 2017/0346545 | A1* | 11/2017 | Islam | H04B 7/061 |
| 2017/0359826 | A1* | 12/2017 | Islam | H04W 72/042 |
| 2017/0366311 | A1* | 12/2017 | Iyer | H04L 5/0007 |
| 2017/0373743 | A1* | 12/2017 | Park | H04L 5/0091 |
| 2018/0027594 | A1* | 1/2018 | Nagaraja | H04B 7/0695 370/329 |
| 2018/0034525 | A1* | 2/2018 | Park | H04L 5/0048 |
| 2018/0034531 | A1* | 2/2018 | Sadiq | H04W 72/046 |
| 2018/0034669 | A1* | 2/2018 | Barbieri | H04L 25/02 |
| 2018/0048334 | A1* | 2/2018 | Sarkis | H04L 1/0057 |
| 2018/0048413 | A1* | 2/2018 | Liu | H04W 48/18 |
| 2018/0048422 | A1* | 2/2018 | Park | H04L 1/00 |
| 2018/0049082 | A1* | 2/2018 | Kinthada Venkata | H04W 56/001 |
| 2018/0049097 | A1* | 2/2018 | Chen | H04W 40/12 |
| 2018/0083767 | A1* | 3/2018 | Sadiq | H04L 7/048 |
| 2018/0091173 | A1* | 3/2018 | Axmon | H04L 1/0059 |
| 2018/0110057 | A1* | 4/2018 | Park | H04B 7/0404 |
| 2018/0110074 | A1* | 4/2018 | Akkarakaran | H04W 72/0413 |
| 2018/0206244 | A1* | 7/2018 | Yang | H04W 72/085 |
| 2018/0220426 | A1* | 8/2018 | Rico Alvarino | H04J 11/005 |
| 2018/0227886 | A1* | 8/2018 | Chou | H04W 72/046 |
| 2018/0241416 | A1* | 8/2018 | Axmon | H03M 13/093 |
| 2018/0242231 | A1* | 8/2018 | Reial | G06N 5/04 |
| 2018/0248600 | A1* | 8/2018 | Kasher | H04B 7/0684 |
| 2018/0262215 | A1* | 9/2018 | Sharon | H03M 13/458 |
| 2018/0269947 | A1* | 9/2018 | Levitsky | H04B 7/0626 |
| 2018/0278379 | A1* | 9/2018 | Sun | H04L 1/00 |
| 2018/0324022 | A1* | 11/2018 | Sheng | H04W 36/0061 |
| 2018/0331730 | A1* | 11/2018 | Sanderovich | G01S 13/4454 |
| 2018/0331802 | A1* | 11/2018 | Bhattad | H04W 36/0072 |
| 2018/0352520 | A1* | 12/2018 | Zhang | H04W 52/40 |
| 2019/0007116 | A1* | 1/2019 | Chang | H04B 7/0695 |
| 2019/0029005 | A1* | 1/2019 | Bendlin | H04L 5/0053 |
| 2019/0044601 | A1* | 2/2019 | Chang | H04L 5/0092 |
| 2019/0068270 | A1* | 2/2019 | Schenk | H04B 7/088 |
| 2019/0288824 | A1* | 9/2019 | Chavva | H04L 5/14 |
| 2019/0319686 | A1* | 10/2019 | Chen, IV | H04B 7/0639 |
| 2019/0372712 | A1* | 12/2019 | Yang | H04L 1/0068 |
| 2019/0380113 | A1* | 12/2019 | Shin | H04L 1/18 |
| 2020/0036477 | A1* | 1/2020 | Xu | G06F 9/30029 |
| 2020/0100214 | A1* | 3/2020 | Wei | H04L 1/0045 |

FOREIGN PATENT DOCUMENTS

| | | | | |
|---|---|---|---|---|
| WO | WO-2016210302 | A1* | 12/2016 | H04B 7/0695 |
| WO | WO-2017000999 | A1* | 1/2017 | H04L 5/005 |
| WO | WO-2017011069 | A1* | 1/2017 | H04L 1/0061 |
| WO | WO-2018175091 | A1* | 9/2018 | H04B 7/063 |

* cited by examiner

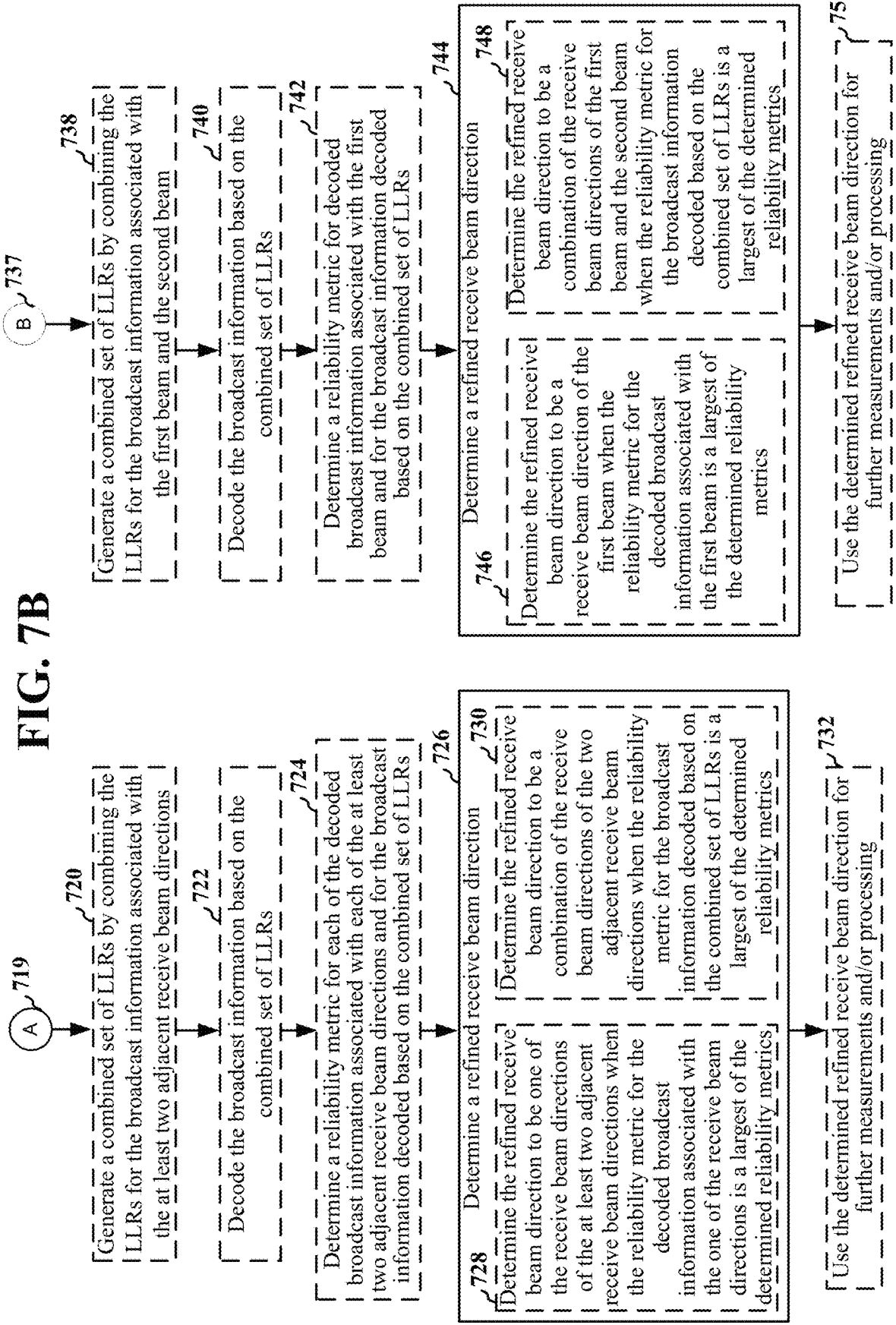

METHODS AND APPARATUS RELATED TO BEAM REFINEMENT

CROSS-REFERENCE TO RELATED APPLICATION(S)

This application claims the benefit of U.S. Provisional Application Ser. No. 62/549,393 entitled "METHODS AND APPARATUS RELATED TO BEAM REFINEMENT DURING INITIAL CELL SEARCH" filed on Aug. 23, 2017, which is expressly incorporated by reference herein in its entirety.

BACKGROUND

Technical Field

The present disclosure relates generally to communication systems, and more particularly, to methods and apparatus related to beam refinement during initial cell search, e.g., using physical broadcast channel (PBCH) decoding.

Introduction

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. Some aspects of 5G NR may be based on the 4G Long Term Evolution (LTE) standard. There exists a need for further improvements in 5G NR technology. These improvements may also be applicable to other multi-access technologies and the telecommunication standards that employ these technologies. For example, improvements in methods and techniques related to a beam refinement process and/or for determining finer beam direction are desirable.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Various aspects described herein are directed to methods and apparatus for beam refinement to determine a refined receive beam direction, e.g., during an initial cell search procedure. The initial cell search procedure may be performed by a user equipment (UE) to acquire synchronization and establish a connection to a base station. Performing the cell search procedure may allow the UE to detect cell timing and a cell identifier (ID) through a primary synchronization signal (PSS)/secondary synchronization signal (SSS) that may be received by the UE during the initial cell search, as well as to decode the master information block (MIB) carried in the physical broadcast channel (PBCH). In an aspect, a beam refinement process may be used to determine the refined receive beam direction. The beam refinement process may be based on PBCH decoding, e.g., decoding of broadcast information on a PBCH received by a device via a plurality of beams.

In an aspect of the disclosure, a method, a computer-readable medium, and an apparatus are provided. The apparatus may be a UE configured to receive a plurality of beams through a plurality of different receive beam directions, each of the beams including broadcast information on a PBCH. The apparatus may be further configured to determine, for each of a subset of the received beams, log likelihood ratios (LLRs) for coded bits of the broadcast information. The apparatus may be further configured to decode the broadcast information associated with each of the subset of the received beams, and determine a refined receive beam direction based on the determined LLRs and based on whether the broadcast information associated with each of the subset of the received beams fails to decode or is successfully decoded.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
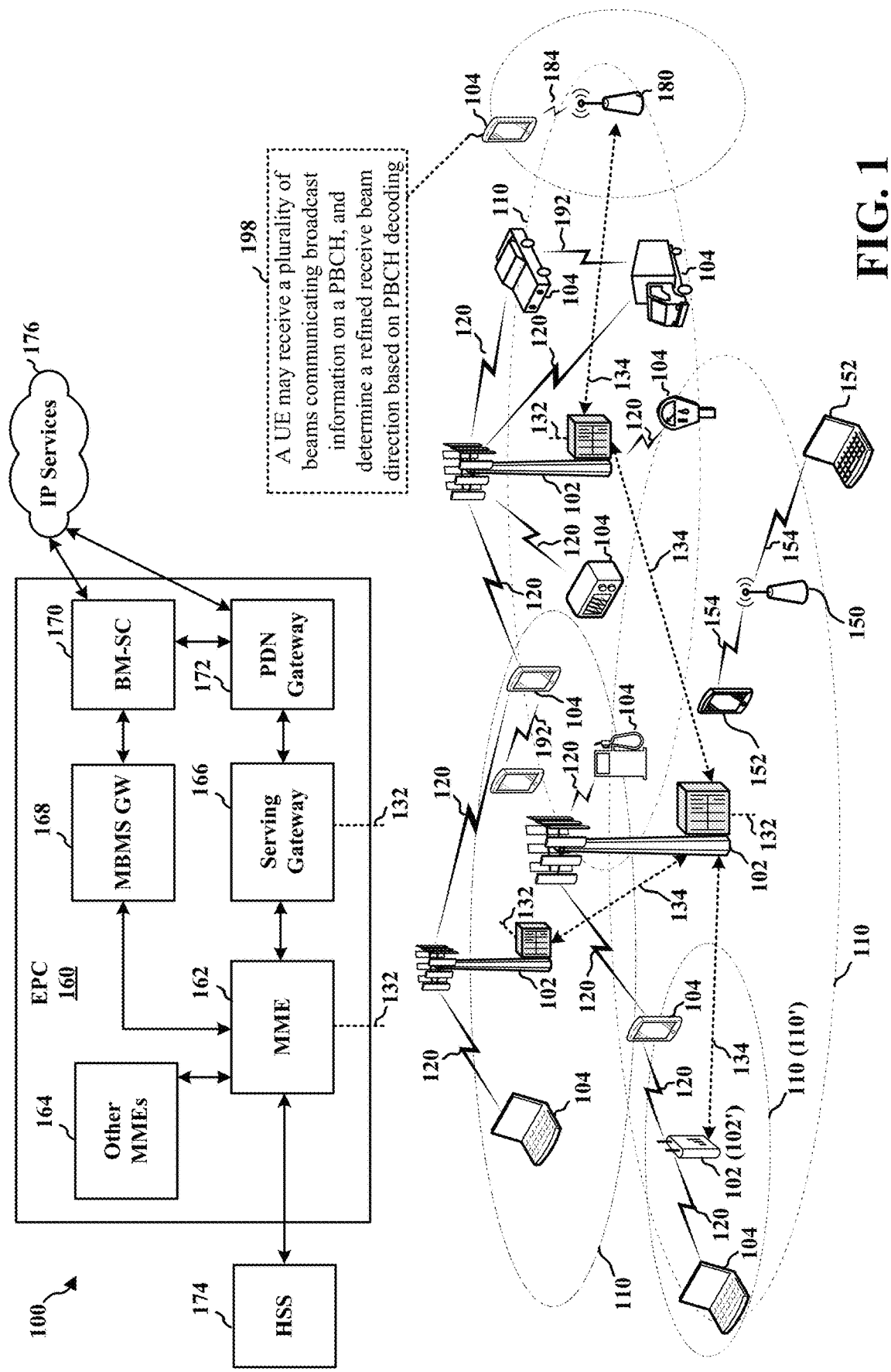
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media may include a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that may be used to store computer executable code in the form of instructions or data structures that may be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include base stations. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 192. The D2D communication link 192 may use the DL/UL WWAN spectrum. The D2D communication link 192 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The gNodeB (gNB) 180 may operate in millimeter wave (mmW) frequencies and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 104 to compensate for the extremely high path loss and short range.

The EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a gNB, Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a toaster, or any other similar functioning device. Some of the UEs 104 may be referred to as IoT devices (e.g., parking meter, gas pump, toaster, vehicles, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the UE 104, may be configured to receive a plurality of beams through a plurality of different receive beam directions, each of the beams including broadcast information on a PBCH, and perform a beam refinement process to determine a refined receive beam direction based on PBCH decoding (198). For example, the UE 104 may determine, for each of a subset of the received beams, LLRs for coded bits of the broadcast information, and decode the broadcast information associated with each received beam of the subset of the received beams (198). The UE 104 may then determine a refined receive beam direction based on the determined LLRs and based on whether the broadcast information associated with each received beam of the subset of the received beams fails to decode or is successfully decoded (198).

Figure 2:
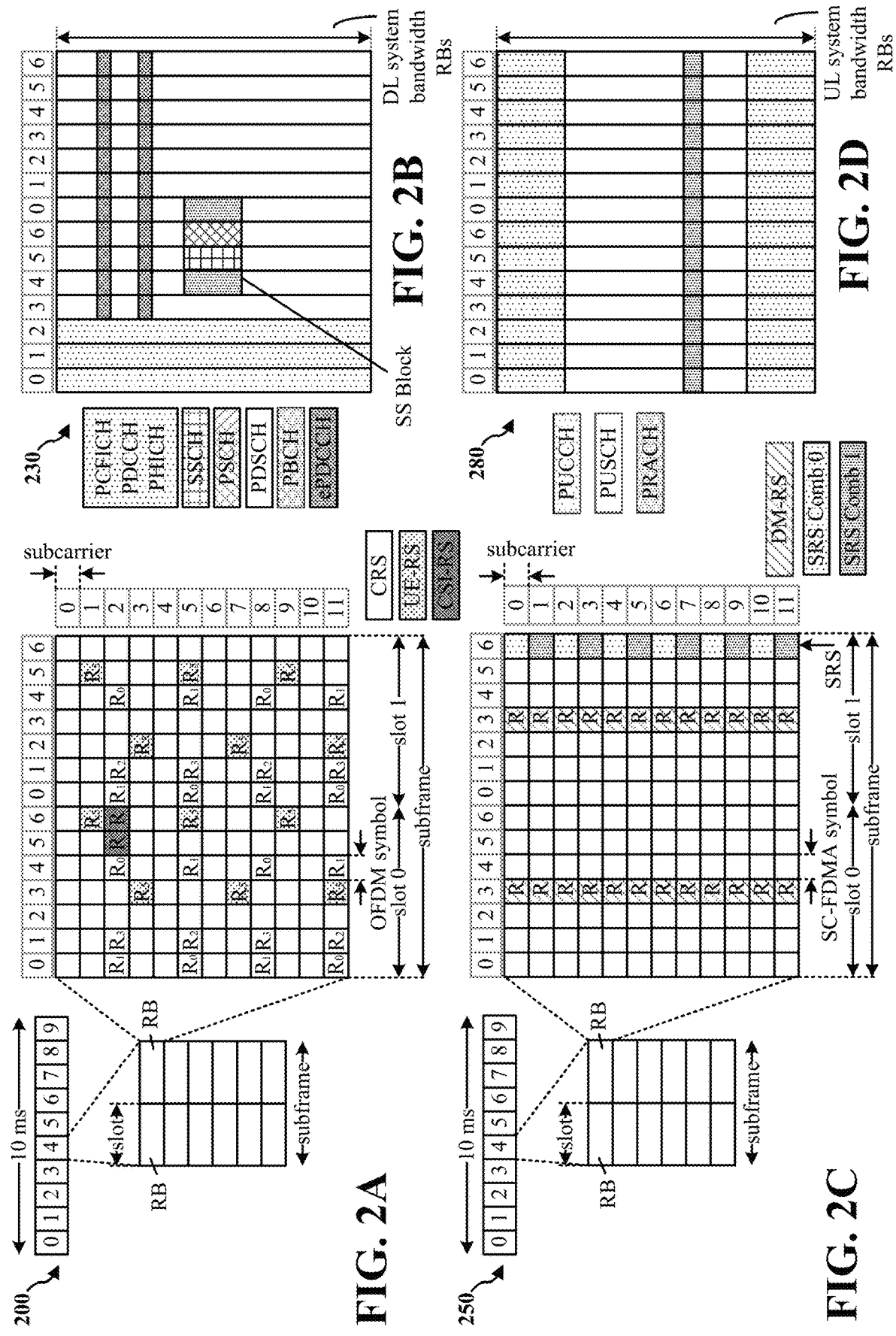
FIGS. 2A, 2B, 2C, and 2D are diagrams illustrating LTE examples of a DL frame structure, DL channels within the DL frame structure, an UL frame structure, and UL channels within the UL frame structure, respectively.

FIG. 2A is a diagram 200 illustrating an example of a DL frame structure. FIG. 2B is a diagram 230 illustrating an example of channels within the DL frame structure. FIG. 2C is a diagram 250 illustrating an example of an UL frame structure. FIG. 2D is a diagram 280 illustrating an example of channels within the UL frame structure. Other wireless communication technologies may have a different frame structure and/or different channels. A frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). For a normal cyclic prefix, an RB may contain 12 consecutive subcarriers in the frequency domain and 7 consecutive symbols (for DL, OFDM symbols; for UL, SC-FDMA symbols) in the time domain, for a total of 84 REs. For an extended cyclic prefix, an RB may contain 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as $R_0$, $R_1$, $R_2$, and $R_3$, respectively), UE-RS for antenna port 5 (indicated as $R_5$), and CSI-RS for antenna port 15 (indicated as R).

FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) may be within symbol 6 of slot 0 within subframes 0 and 5 of a frame. The PSCH carries a primary synchronization signal (PSS) that is used by a UE 104 to determine subframe/symbol timing and a physical layer identity. The secondary synchronization channel (SSCH) may be within symbol 5 of slot 0 within subframes 0 and 5 of a frame. The SSCH carries a secondary synchronization signal (SSS) that is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DL-RS. The physical broadcast channel (PBCH), which carries a master information block (MIB), may be logically grouped with the PSCH and SSCH to form a synchronization signal (SS) block. The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the base station. The UE may additionally transmit sounding reference signals (SRS) in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
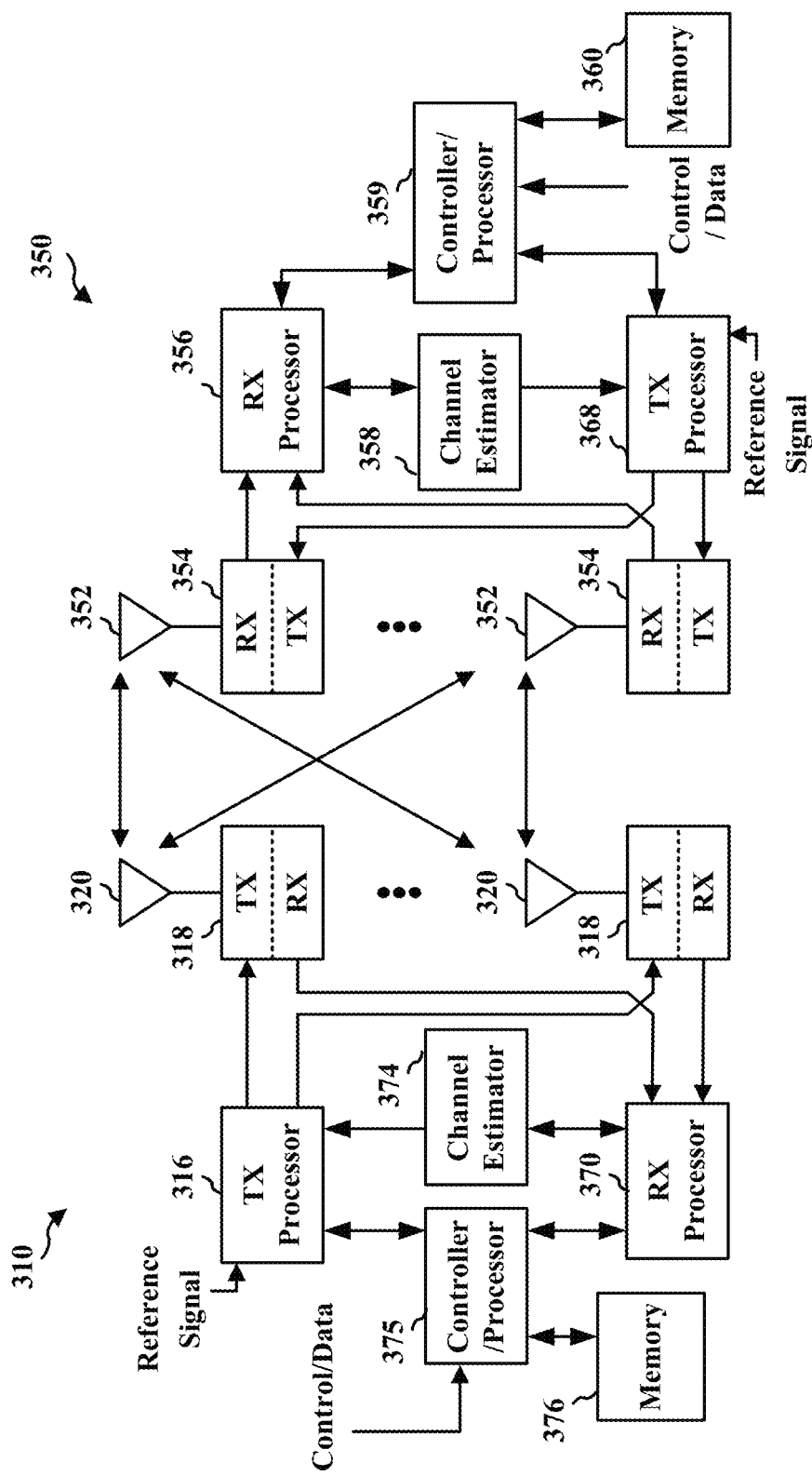
FIG. 3 is a diagram illustrating an example of an evolved Node B (eNB) and UE in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

Cellular systems typically employ periodic or frequent transmission of broadcast information, such as the PBCH in LTE and other systems. Via the PBCH, the base station may broadcast a number of parameters needed for initial access of the cell such as, for example, downlink system bandwidth, the Physical Hybrid ARQ Indicator Channel structure, and the most significant bits of the System Frame Number. The parameters may be carried in a MIB.

Figure 4:
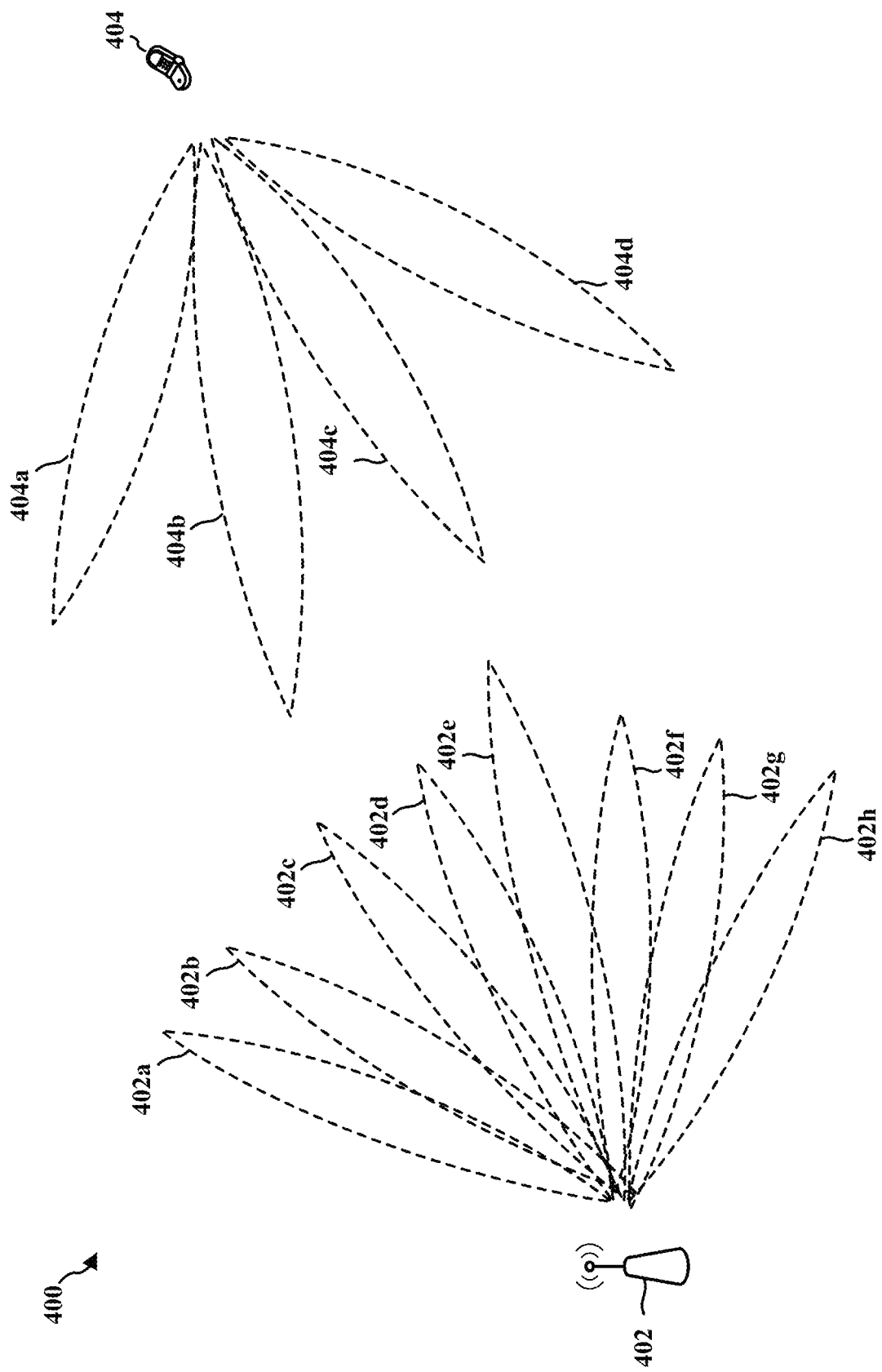
FIG. 4 is a diagram illustrating a base station in communication with a UE.

FIG. 4 is a diagram 400 illustrating a base station 402 (e.g., a gNB) in communication with a UE 404. The base station 402 and the UE 404 may be a part of a mmW communication system. Referring to FIG. 4, the base station 402 may transmit a beamformed signal to the UE 404 in one or more of the directions 402a, 402b, 402c, 402d, 402e, 402f, 402g, 402h. The UE 404 may receive the beamformed signal from the base station 402 in one or more receive directions 404a, 404b, 404c, 404d. The UE 404 may also transmit a beamformed signal to the base station 402 in one or more of the directions 404a-404d. The base station 402 may receive the beamformed signal from the UE 404 in one or more of the receive directions 402a-402h. The base station 402/UE 404 may perform beam training to determine the best receive and transmit directions for each of the base station 402/UE 404. The transmit and receive directions for the base station 402 may or may not be the same. The transmit and receive directions for the UE 404 may or may not be the same.

To acquire synchronization and establish a connection to a base station (e.g., a gNB), a UE (e.g., a 5G NR-UE that supports 5G NR) may perform a so-called initial cell search. The purpose of cell search may include detection of cell timing and a cell identifier (ID) by the UE through a primary synchronization signal (PSS)/secondary synchronization signal (SSS), as well as decoding the MIB carried in the PBCH. The acquired information during the cell search may allow the UE to initiate the random access procedure referred to as the random access channel (RACH) procedure to inform the network about the UE's desire to connect and/or gain access to the network.

In a millimeter wave (mmW) 5G NR system (e.g., with operating frequency >6 GHz), a mmW base station (e.g., a gNB such as base station 180) may transmit the PSS/SSS and the PBCH through beam sweeping, e.g., with a plurality of beams being transmitted in different directions in a time division multiplexed (TDM) fashion. A UE (e.g., such as UE 104) attempting to acquire system synchronization information and establish a connection may attempt to scan/receive in all of the UE's receive directions, for example, in 4 directions/orientations. The UE may receive a plurality of beams and perform the initial cell search on more than a single received (RX) beam. For example, in some configurations, the UE may perform initial cell search on all the UE's RX beams, e.g., 4 relatively wide (90°) RX beams in 4 directions. The RX beam where the strongest cell has been detected, may be used as the RX beam to continue to update measurements of the detected cell. Utilizing reciprocity, the same steering direction may be used as the direction of a transmit (TX) beam for the RACH procedure. For example, for initiating the RACH procedure, the UE may then use this direction for sending beamformed signals/messages (e.g., RACH preambles) to the mmW base station.

To refine the RX beam (e.g., to determine a refined/finer receive beam direction) at the UE, the UE may perform measurements of the detected cell by repeating the measurements for various refined RX beams (e.g., for various finer RX beam directions). However, the above approach of RX beam refinement may add latency and significantly increase power consumption due to increased RF open time (e.g., time for which RF elements need to stay on), e.g., because of having to perform the measurements for various refined (finer) beam directions. The added latency is owing to the fact that typically a mmW UE may not be able to listen on more than one RX beam (corresponding to one finer direction) at a time due to RF limitations. Thus, the UE may listen and perform measurements on one refined RX beam at a time. If measurements for multiple receive beam directions are performed for beam direction refinement (e.g., to find the best refined RX beam direction) then such measurements may be performed in different time intervals which may add to the latency. With regard to the increased power consumption, the power consumption is dominated by the on time for RF elements in mmW devices, e.g., with relatively more power consumption caused by the operation of RF elements (e.g., receive and/or transmit chains/circuitry) due to longer on time. Thus, in view of the above, it should be appreciated that improved methods and apparatus for determining a refined receive beam direction are desired.

Various features and aspects described herein relate to methods and apparatus for determining a refined receive beam direction based on decoding of broadcast information communicated via a plurality of beams which may be received by a UE during an initial cell search. The broadcast information may include, e.g., master information block (MIB) carried by the PBCH. Thus, as discussed infra, in accordance with certain aspects of the disclosure, beam refinement may be performed based on PBCH decoding. Various aspects and features of the methods described herein may reduce and/or overcome the various shortcomings (e.g., latency and power higher consumption) discussed above associated with some other beam refinement approaches. Thus, various aspects and features of the methods described herein may reduce beam refinement delays and power consumption associated with a beam refine process.

In an aspect, a UE may receive a plurality of beams (e.g., corresponding to different receive directions) from a cell, e.g., gNB serving the cell, during the initial cell search performed by the UE. Each of the received beams from the given cell may include synchronization information (e.g., PSS and SSS) and broadcast information, e.g., MIB carried in the PBCH. Each received beam from the same cell may carry the same broadcast information.

Figure 5:
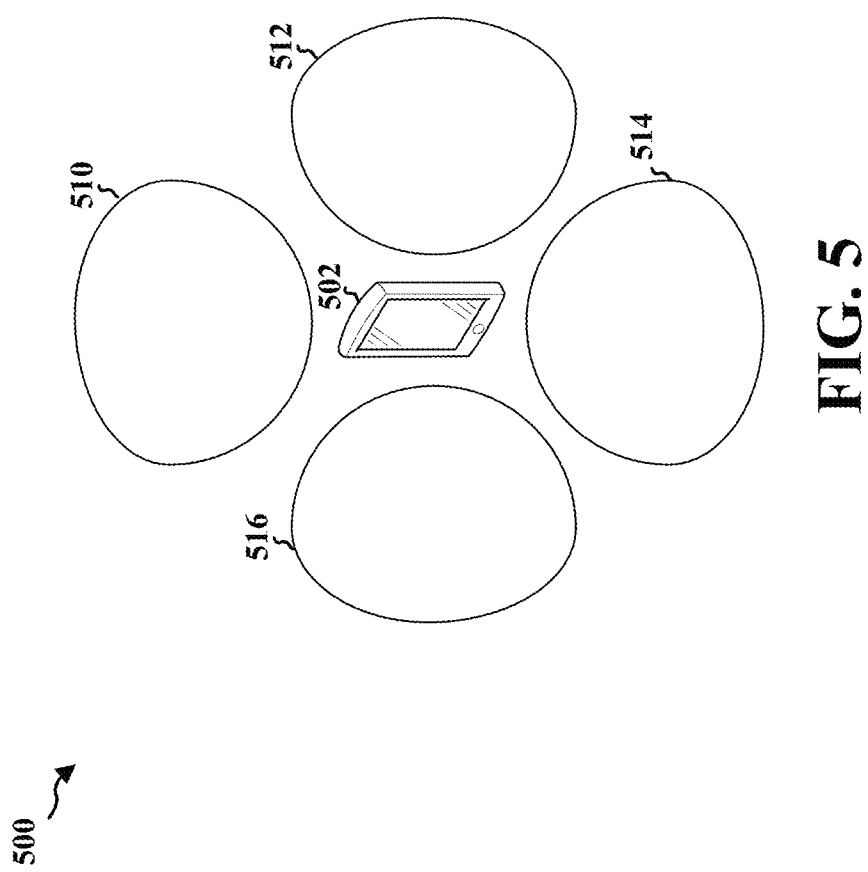
FIG. 5 illustrates an example showing a UE receiving a plurality of beams corresponding to 4 different receive directions.

FIG. 5 is a diagram 500 illustrating a UE 502 (e.g., a mmW UE) receiving 4 beams 510, 512, 514 and 516, e.g., 4 relatively wide (90°) beams corresponding to 4 different receive directions, during an initial cell search performed by the UE 502. The UE 502 may be any one of the UEs 104, 350, 404. While in the illustrated example, the number of received beams is 4, the number of received beams during the initial cell search may be less or more. The UE may then proceed to perform PBCH decoding on at least some of the received beams, e.g., on a subset of the received beams. The subset of the received beams may be determined/selected based on a reliability metric determined from the processing in prior stages, for example, the processing of received PSS and SSS via the received beams. For example, a subset of received beams to be decoded may be selected based on power measurements on the PSS/SSS signals on the received beams, e.g., by selecting the received beams having strong PSS/SSS (and thus higher probability of cell detection) as the subset of the received beams for decoding and further processing. For the purposes of discussion of FIGS. 5-6, consider that the UE 502 may attempt to decode PBCH on all 4 received beams 510, 512, 514 and 516.

Figure 6:
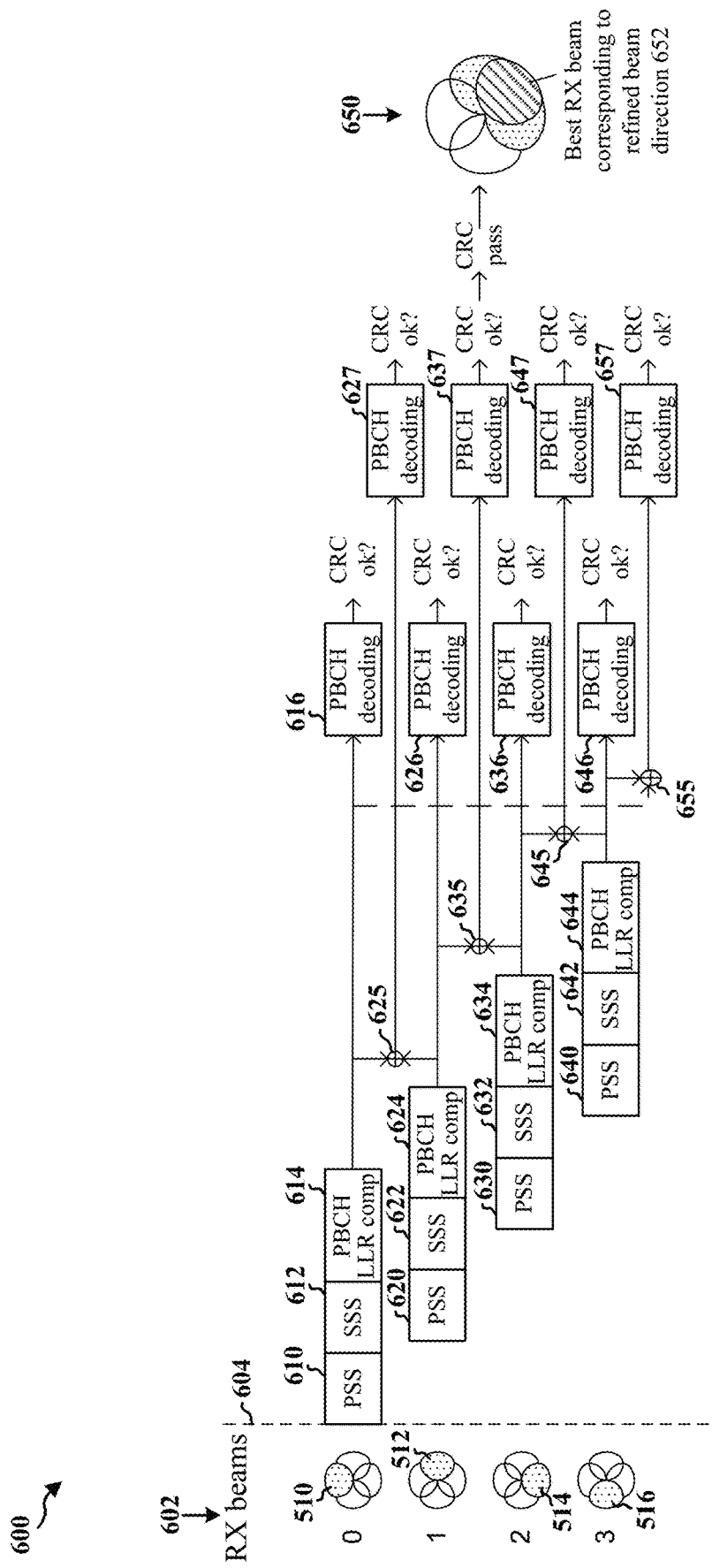
FIG. 6 illustrates an example of processing associated with a PBCH decoding based beam refinement method.

FIG. 6 is a diagram 600 illustrating an example of processing associated with a PBCH decoding based beam refinement method. The processing is discussed with the reference to UE 502 and the plurality of beams illustrated in FIG. 5. In the illustration, the 4 received beams are shown on the left side of line 604 and indicated by arrow 602 while the corresponding processing of each of the 4 received beams 510, 512, 514 and 516 is illustrated to the right of line 604. The processing of each of the 4 received beams 510, 512, 514 and 516 may include various stages including PSS processing, SSS processing, LLR computation for coded broadcast information (e.g., PBCH), decoding and cyclic redundancy check (CRC) as illustrated in the diagram 600. In one configuration, for a detected cell (which may be determined by cell timing and cell ID obtained via the received PSS and SSS), the UE 502 may determine/compute log-likelihood ratios (LLRs) for the coded bits of the broadcast information (also referred to as PBCH coded bits) for each of the 4 received beams 510, 512, 514 and 516 individually. That is, for each received beam corresponding to the given detected cell, the UE 502 may determine LLRs of the coded bits of the broadcast information included in the RX beam (as illustrated by 614, 624, 634, and 644). While in the particular example being discussed, the UE 502 may perform PBCH decoding on each of the 4 received beams as shown, in some other configurations, the UE 502 decide to perform PBCH decoding and further processing related to beam refinement on a subset of the received beams. The LLR is a reliability metric used in communication systems and may be determined, e.g., by a receiving UE, for each received bit stream on a per bit basis. For a given bit of a bit stream in a received beam, a strongly positive value of an LLR may imply that the bit is most likely 0 whereas a negative value may imply that the bit is most likely 1.

As illustrated, for the first received beam 510, the UE 502 may process the PSS received via beam 510 in the PSS processing stage 610 and process the SSS received via beam 510 in the SSS processing stage 612. The cell timing and a cell ID corresponding to the detected call may be determined through the received PSS and SSS. The UE 502 may generate LLRs corresponding to the coded bits of the broadcast information (PBCH coded bits) associated with the first received beam 510 in the PBCH LLR computation stage 614. Next, based on the determined LLRs corresponding to the coded bits of the broadcast information communicated in the first received beam 510, the UE 502 may perform PBCH decoding at 616 and perform a CRC to determine whether the decoding at 616 is successful. Similarly, for the RX beams 512, 514, and 516, the UE 502 may process the PSS received via beams 512, 514, and 516 in the corresponding PSS processing stages 620, 630, and 640, and process the SSS received via beams 512, 514, and 516 in the corresponding SSS processing stages 622, 632, and 642 respectively. The UE 502 may generate LLRs corresponding to the coded broadcast information (PBCH coded bits) associated with the beams 512, 514, and 516 in the PBCH LLR computation stages 624, 634, and 644 respectively. Based on the determined LLRs corresponding to the PBCH coded bits communicated in the beams 512, 514, and 516, the UE 502 may individually decode coded broadcast information associated with each of the beams at corresponding decoding stages 626, 636, and 646, respectively. Furthermore, each PBCH decoding 626, 636, and 646 may be followed by a corresponding CRC pass/fail determination as shown in the diagram 600. The PBCH decoding for the multiple received beams may be performed asynchronously in parallel (e.g., concurrently using multiple parallel decoders) or sequentially in any order.

In an aspect, depending on the result of PBCH decoding (at 616, 626, 636, 646) on each of the beams 510, 512, 514 and 516, beam refinement may be performed in a number of different ways in accordance with the methods described herein. For example, in one configuration, if PBCH decoding fails (e.g., the CRC fails) for all of the received beams 510, 512, 514 and 516, the UE 502 may combine the generated LLRs for the coded bits of the broadcast information associated with at least two adjacent received beams (e.g., 510 and 512; 512 and 514; 514 and 516; and/or 516 and 510) and attempt to decode PBCH payload based on the combined LLRs (e.g., a set of combined LLRs also referred to as combined set of LLRs). For example, with reference to FIG. 6, if PBCH decoding fails for all of the 4 received beams (e.g., as determined based on CRC failure), the LLRs for the broadcast information associated with beams 510 and 512 which are adjacent (e.g., in a directional sense, as the beam 510 corresponding to the north receive direction is directionally adjacent to the beam 512 corresponding to the east receive direction) are combined as shown in diagram 600 at 625. In the example discussed with respect to FIG. 6, the PBCH payload and the encoded bits are assumed to remain constant for the 4 received beam observation windows, that is, the coded bits of the broadcast information remain the same in all 4 received beams. In such a case, the LLR combining includes summing the LLRs of the coded broadcast information bits (also sometimes referred to as PBCH LLRs) from adjacent received beams. The UE 502 may then perform PBCH decoding at 627 based on the combined LLRs (e.g., output of 625 in case of received beams 510 and 512) followed by a CRC to determine if the decoding at 627 is successful. If PBCH decoding (based on the combined LLRs) is successful (e.g., if the CRC passes), then in accordance with one aspect the UE 502 may conclude that the receive beam resulting from a combination of the two adjacent beams may be taken as the refined receive beam (or at least a refined receive beam candidate if other adjacent beam pairs are to be checked) for subsequent processing. That is, a receive beam direction resulting from a combination of the two adjacent receive beam directions (corresponding to beams 510 and 512) may be taken as the refined receive beam direction. For example, in the case of combination of the two adjacent receive beam directions, a direction corresponding to a midpoint between the two adjacent receive beam directions may be considered to correspond to the refined receive beam direction. The subsequent processing may include further processing associated with the initial cell search procedure and/or uplink RACH procedure. If PBCH decoding at 627 based on the combined LLRs is unsuccessful (e.g., if the CRC fails), then the UE 502 may conclude that the refined received beam (and thus a refined receive direction) may not be determined based on the combination of the two adjacent received beams 510 and 512.

In some configurations, prior to deciding on the refined receive beam direction, the UE 502 may perform similar checks for the other directionally adjacent beam pairs, e.g., 512 and 514; 514 and 516; and 516 and 510 (but not 510 and 514 or 512 and 516 since the beams are not adjacent in these cases and are rather in opposite directions). For example, the LLRs for the PBCH coded bits corresponding to beams 512 and 514 (which are directionally adjacent) may be combined at 635 and the UE 502 may then perform PBCH decoding at 637 based on the combined LLRs (e.g., output of 635) followed by a CRC to determine if the decoding at 637 is successful. If PBCH decoding based on the combined LLRs at 637 is successful (e.g., if the CRC passes), then the UE 502 may conclude that a beam direction resulting from a combination of the two adjacent beam directions (corresponding to beams 512 and 514) may be taken as another refined receive beam direction candidate for subsequent processing (e.g., in addition to the refined beam candidate from the combination of RX beams 510 and 512 discussed above) otherwise if the PBCH decoding at 637 fails then the direction corresponding a beam resulting from the combination of the adjacent received beams 512 and 514 is not considered a candidate. Similarly, for the adjacent beam pair 514 and 516, the LLRs for the PBCH coded bits associated with the adjacent beams 514 and 516 may be combined at 645, and the UE 502 may perform PBCH decoding at 647 based on the combined LLRs (e.g., output of 645) followed by a CRC. If the CRC indicates a pass, then the UE 502 may conclude that a beam direction resulting from a combination of the two adjacent beam directions (corresponding to beams 514 and 516) may be taken as another refined receive beam direction candidate. However, if the CRC indicates a failure (decoding at 647 fails) then the beam direction resulting from the combination may not be considered a refined receive beam direction candidate.

For the last adjacent beam pair 516 and 510, the LLRs for the coded bits of the broadcast information associated with beams 516 and 510 may be combined at 655, and the UE 502 may then perform PBCH decoding at 657 based on the combined LLRs (e.g., output of 655) followed by a CRC. If the CRC indicates a pass, then the UE 502 may conclude that a beam direction resulting from a combination of the two adjacent beam directions (corresponding to beams 516 and 510) may be taken as another refined beam candidate for subsequent processing and not if the CRC indicates a failure (e.g., if decoding at 657 fails).

In the case where there may be multiple refined beam candidates (e.g., with more than one successful PBCH decoding based on combined LLRs from corresponding adjacent beams), the UE 502 may consider a post decoding reliability metric (e.g., determined by a channel decoder performing the PBCH decodings) for each of the PBCH decodings (627, 637, 647, and 657) and may select the refined beam direction candidate that corresponds to the corresponding PBCH decoding with the largest post decoding reliability metric. For example, assuming largest reliability metric corresponds to the decoding based on the combined LLRs for the coded broadcast information bits associated with adjacent beams 512 (east receive direction) and 514 (south receive direction), the beam 652 resulting from the combination of the beams 512 and 514 may be taken as the refined receive beam (i.e., the south east receive direction may be considered the refined/best receive beam direction).

In another aspect, if PBCH decoding succeeds on one received beam (e.g., one of the 4 received beams 510, 512, 514, and 516), but fails on the other received beams, the UE 502 may combine the LLR for the broadcast information associated with the beam for which decoding has been successful and LLR for the broadcast information associated with an adjacent beam and attempt to decode the broadcast information (PBCH payload) based on the combined LLRs in the manner discussed above. For example, with reference to FIG. 6, if PBCH decoding (at 626) succeeds for the beam 512 and fails for the other 3 received beams, then the UE 502 may combine the LLRs for the PBCH associated with beams 512 and 510 (which are directionally adjacent) at 625. The UE 502 may then perform PBCH decoding at 627 based on the combined LLRs (e.g., output of 625) followed by a CRC to determine if the decoding at 627 is successful. If PBCH decoding (based on the combined LLRs) is successful (CRC passes), then the UE 502 may take a receive beam direction resulting from a combination of the two adjacent receive beam directions (corresponding to 512 and 510) as one refined beam direction candidate. Because the UE 502 is aware that with the beam 512, one more adjacent beam pair may be formed, e.g., with the beams 512 and 514, the UE 502 may perform similar processing for the adjacent beams 512 and 514. That is, the UE 502 may combine the LLRs for the PBCH associated with beams 512 and 514 at 635, and may perform PBCH decoding at 637 based on the combined LLRs (e.g., output of 635) followed by a CRC to determine if the decoding at 637 is successful. If PBCH decoding at 637 (based on the combined LLRs) is also successful (CRC passes), then a receive beam direction resulting from a combination of the two adjacent receive beam directions (corresponding to beams 512 and 514) may also be considered as another refined receive beam direction candidate. Again, because there are more than one refined receive beam direction candidate (e.g., beam direction corresponding to beam 512 for which PBCH decoding succeeded, beam direction resulting from the combination of the adjacent receive beam directions corresponding to adjacent beams 512 and 510 for which the combined LLRs based PBCH decoding succeeded, and beam direction resulting from the combination of the adjacent receive beam directions corresponding to beams 512 and 514 for which the combined LLRs based PBCH decoding succeeded), the UE 502 may consider post decoding reliability metric for each of the corresponding PBCH decodings (626, 627, and 637) and may select the refined receive beam direction candidate that corresponds to the decoding with the highest post decoding reliability metric. For example, assuming that the post decoding reliability metric for the combined LLRs based PBCH decoding at 637 is highest, the UE 502 may take the receive beam direction corresponding to beam 652 resulting from the combination of the adjacent beams 512 and 514 as the best receive beam direction and use RX beam 520 for subsequent processing.

In yet another aspect, if PBCH decoding succeeds on more than one received beams, and at least 2 of the succeeding received beams are adjacent, the UE 502 may combine the LLRs for the PBCH associated with the two adjacent beams and perform PBCH decoding based on the combined LLRs in a similar manner as discussed above. Again, the UE 502 may subsequently analyze decoding results, and based on the post decoding reliability metrics provided by the channel decoder, the UE 502 may select the best receive beam direction. For example, if the largest metric is obtained for the combined LLRs based PBCH decoding, then the UE 502 may select the receive beam direction resulting from the combination of the two adjacent receive beam directions (corresponding to the two adjacent receive beams for which PBCH decoding succeeded), otherwise, the UE 502 may select the beam direction corresponding to the original beam with largest metric.

While the above examples discussed with respect to FIGS. 5-6, describe the beam refinement methods considering 4 received beams to facilitate an understanding of the concepts, the techniques and concepts described supra may be generalized to multiple (e.g., fewer or more) beams. For example, the UE 502 may receive N received beams and decode PBCH on a subset R ($|R| \leq N$) of the N received beams (where "| |" denotes cardinality/number of elements of a set), and may attempt to decode PBCH on all pairs of a beam subset P of R ($|P| \leq |R|$), e.g., with PBCH decoding on each beam pair being based on combined LLRs as discussed above in detail with respect to FIG. 6. Furthermore, in various configurations, each beam pair being considered for PBCH decoding may include beams which are adjacent to each other, e.g., directionally adjacent. In an aspect, the selection of the subset R and P may, e.g., be based on reliability metrics obtained from the prior processing stages (e.g., based on PSS/SSS). With regard to combining PBCH LLRs (e.g., the LLRs for the PBCH of directionally adjacent received beams), if the PBCH payload and the encoded bits are assumed to remain constant for the different N received beam observation windows, LLR combining may include summing the LLRs of all N included received beams. However, if the encoded bits change (e.g., due to time-dependent scrambling), LLR combining may first need to compensate for the difference on the encoded bits (e.g., by de-scrambling) followed by the summation of the LLRs corresponding to the individual RX beams. If the PBCH payload bits change, various techniques of using decoding of multiple hypothesis of combined LLRs may be used. While current wireless communication standards (e.g., 3GPP specifications) have not finalized PBCH payload definition and exact PBCH payload encoding, depending on a final agreement one or more of the methods described above may be used. The examples discussed above with respect to FIG. 6 assume N=4, $|R|=4$ and $|P|=4$, as well as constant PBCH payload and encoded bits.

As discussed above, the UE 502 may use the refined beam (e.g., best beam/direction) for subsequent measurements during the initial cell search as well as use the determined refined receive beam direction as the best transmit beam direction (assuming channel reciprocity), e.g., to perform processing/signaling related UL RACH procedure. That is, the UE 502 may use the refined beam direction as the best transmit direction for transmission during UL RACH, e.g., for initiating the RACH procedure, the UE 502 may use the determined refined receive beam direction as the best transmit direction for sending UL RACH signals, e.g., RACH preambles, to the mmW base station. With the above discussed approach, the success probability of UL RACH may significantly increase due to the refined beam selection. Furthermore, the additional complexity of the beam refinement process (e.g., with the additional PBCH decoding) discussed above may be lower compared to scanning with finer beam resolution as in some other beam refinement techniques.

Figures 7, 7A, 7B:
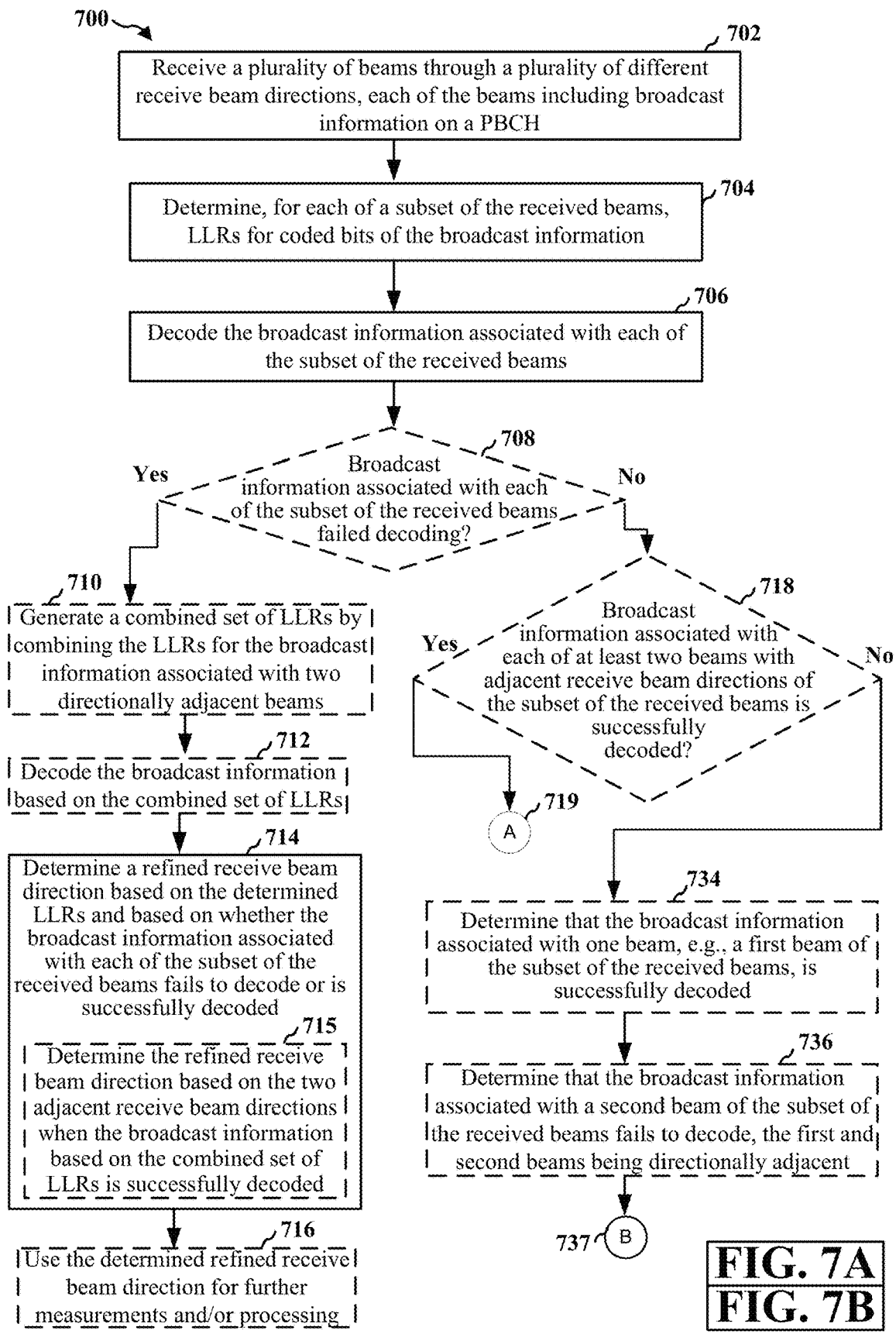
FIG. 7A is a first part of a flowchart of an exemplary method of wireless communication of a UE, in accordance with one configuration.
FIG. 7B illustrates a second part of the flowchart of the exemplary method of wireless communication of the UE, with FIG. 7 comprising the combination of FIG. 7A and FIG. 7B.

FIG. 7, which comprises a combination of FIGS. 7A and 7B, is a flowchart 700 of a method of wireless communication. The method of flowchart 700 may be performed by an apparatus (e.g., the UE 104, 350, 404, 502, apparatus 802/802'). The first part of the flowchart 700 is illustrated in FIG. 7A and the second part of the flowchart 700 is illustrated in FIG. 7B. Blocks shown as dashed boxes are optional and may or may not be performed in certain embodiments. Reference to FIGS. 5-6 may be made to facilitate the discussion of flowchart 700. At 702, the apparatus (e.g., UE 502) may receive a plurality of beams through a plurality of different receive beam directions, each of the beams including broadcast information on a PBCH.

For example, referring to FIG. 5 example, the UE 502 may receive a plurality of beams 510, 512, 514, and 516, each corresponding to a different receive directions and each communicating a broadcast information associated with a PBCH. The plurality of beams may be received, e.g., during an initial cell search performed by the UE 502.

At 704, the apparatus may determine, for each of a subset of the received beams, log likelihood ratios (LLRs) for coded bits of the broadcast information. While multiple beams may be received, the apparatus may decide to pursue a subset of the total number of received beams for further processing and decoding as not all of the received beams may produce desired decoding results. For example, the UE 502 may select a subset of the received beams based on, for example, the processing of received PSS and SSS in the received beams, e.g., based on power measurements on the PSS/SSS signals on the received beams. In one configuration, the UE 502 may select the subset of received beams with strong power measurements for PSS/SSS for further decoding and/or further processing. For simplifying the discussion, consider that the UE 502 may select a subset of 2 received beams (e.g., beams 512 and 514 may be selected as having strongest cell measurements) and attempt to decode the broadcast information on the 2 received beams. In some configurations, the UE 502 may first determine LLRs for the coded bits of the broadcast information associated with the subset of the received beams. In the above example (with the subset including 2 received beams), the UE 502 may generate a first set of LLRs corresponding to the coded bits of the broadcast information associated with a first beam (e.g., as illustrated at 624 for beam 512 in FIG. 6) of the subset and a second set of LLRs corresponding to the coded bits of the broadcast information associated with a second beam (e.g., as illustrated at 634 for beam 514 in FIG. 6) of the subset. Thus, the first set of LLRs may include LLRs for the coded bits of the broadcast information associated with the beam 512 and the second set of LLRs may include LLRs for the coded bits of the broadcast information associated with the beam 512.

At 706, the apparatus may attempt to decode the broadcast information associated with each of the subset of the received beams. The decoding may be performed by the apparatus sequentially or concurrently. In various configurations, each of the broadcast information decodings may be performed based on the corresponding LLR values. For example, with reference to FIG. 6, the apparatus may decode (626) the broadcast information associated with the first beam based on the first set of LLRs (e.g., output from 624) and the broadcast information associated with the second beam may be decoded (636) based on the second set of LLRs (e.g., output from 634).

Next at 708, in one configuration, the apparatus may determine whether the broadcast information associated with each received beam of the subset of the received beams failed decoding. For example, the apparatus may determine whether the decodings at 706 are successful, e.g., based on whether the CRC checks performed after the decodings are successful. If at 708 it is determined that broadcast information associated with each of the beams of the subset of received beams failed decoding, that is, the decoding of the PBCH for each of the beams in the subset of received beams failed (e.g., CRC fails for each decoding), the operation proceeds to 710.

At 710, the apparatus may generate a combined set of LLRs by combining the LLRs for the broadcast information associated with two adjacent receive beam directions. For example, with reference to FIG. 6, the subset of beams for which decoding is performed may include 2 beams, e.g., 512 and 514, that are directionally adjacent. If individual decoding for the broadcast information in each of the beams 512 and 514 fails, then in accordance with an aspect the UE 502 may generate a combined set of LLRs by combining the first set of LLRs (e.g., for the coded bits of the broadcast information associated with the beam 512) and the second set of LLRs (e.g., for the coded bits of the broadcast information associated with the beam 514). In the cases where the subset of received beams may have a number of additional beams, e.g., 4 beams, the UE 502 may determine a combined set of LLRs for each pair of adjacent beams as discussed in detail with respect to FIG. 6. As discussed earlier, the phrase adjacent beams refers to beams that are directionally adjacent, e.g., having adjacent receive beam directions.

At 712, the apparatus may decode the broadcast information based on the combined set of LLRs. For example, with reference to FIG. 6, the UE 502 may decode (at 637) the coded bits of the broadcast information based on the combined LLRs (e.g., output from the LLR combining stage 635). For the purposes of discussion, it is assumed that the broadcast information remains the same in each of the beams of the subset and the broadcast information of either of the beams 512 or 514 may be decoded based on the combined set of LLRs. Because the decoding is performed based on the combined set of LLRs, the probability of successfully decoding the broadcast information at 712 may be higher as compared to the chances of successful decoding at 706.

At 714, the apparatus may perform beam refinement to determine a refined receive beam direction based on the determined LLRs and based on whether the broadcast information associated with each beam of the subset of the received beams fails to decode or successfully decodes. In the above case where broadcast information associated with each received beam of the subset of the received beams failed individual decoding, the beam refinement operation at 714 may include the operation illustrated with respect to box 715 where the refined receive beam direction is determined based on the two adjacent receive beam directions (e.g., beam directions corresponding to the two adjacent beams of the subset) when the broadcast information decoded based on the combined LLRs successfully decodes. Assuming that the broadcast information based on the combined LLRs is successfully decoded at 712, the apparatus may select, as the refined receive beam direction, a direction resulting from the combination of the two adjacent beam directions. For example, with reference to FIG. 6, if the decoding (at 626 and 636) of the individual beams 512 and 514 fails but the decoding (at 637) based on the combined LLRs is successful, then the UE 502 may determine that the receive beam direction resulting from the combination of the individual receive beams directions corresponding to beams 512 and 514 may be taken as the refined receive beam direction. For example, as illustrated in FIG. 6, if the beam 512 is associated with the east receive direction and beam 514 is associated with the south receive direction, then in the above discussed case, at 715 the UE may determine that the south east direction is the refined receive beam direction. In an aspect, having determined the refined receive beam direction, at 716 the apparatus may use the determined receive beam direction for performing further measurements and/or in subsequent operations, e.g., related to the initial cell search procedure and/or related to the RACH procedure.

Returning to the operation at 708, if at 708 it is determined that broadcast information associated with each of the received beams of the subset of received beams did not fail decoding (that is, the broadcast information decoding did not fail for all beams of the subset of beams, e.g., CRC succeeds for at least one or more of the beams), the operation proceeds to 718. At 718, the apparatus may determine whether broadcast information associated with each of at least two beams of the subset with adjacent receive beam directions is successfully decoded. In other words, the apparatus may determine if PBCH decoding succeeds for more than one beam, e.g., for two or more adjacent beams of the subset of the received beams. If at 718 it is determined that the broadcast information associated with each of at least two beams with adjacent receive beam directions is successfully decoded, the operation proceeds to 720 via connecting node A 719.

For the purposes of discussion, consider that the broadcast information associated with two beams with adjacent receive beam directions (e.g., beams 512 and 514) is successfully decoded. With the above consideration, in accordance with an aspect of one configuration, at 720 the apparatus may generate a combined set of LLRs by combining the LLRs for the broadcast information associated with the two beams with adjacent receive beam directions. For example, with reference to FIG. 6, if the individual decoding for the broadcast information in each of the beams 512 and 514 succeeds (e.g., determined by a successful CRC following each of the decoding 626 and 636), the UE 502 may generate a combined set of LLRs by combining the first set of LLRs (e.g., for the coded bits of the broadcast information associated with the beam 512) and the second set of LLRs (e.g., for the coded bits of the broadcast information associated with the beam 514). In the cases where the subset may have a number of additional beams, e.g., 4 beams, in an aspect the UE 502 may determine a combined set of LLRs for each pair of adjacent beams for which PBCH decoding succeeded as discussed in detail with respect to FIG. 6.

At 722, the apparatus may decode the broadcast information based on the combined set of LLRs. For example, with reference to FIG. 6, the UE 502 may decode (at 637) the coded bits of the broadcast information based on the combined LLRs (e.g., output from the LLR combining stage 635). The UE 502 may then determine whether the decoding based on the combined LLRs is successful. At 724 the apparatus may determine a post decoding reliability metric for each of the decoded broadcast information associated with each of the at least two adjacent receive beam directions (corresponding to the beams 512 and 514 in the example) and for the broadcast information decoded based on the combined LLRs. That is, the apparatus may determine a reliability metric corresponding to each of the PBCH decodings performed by the apparatus. For example, with reference to FIG. 6, considering decoding of the broadcast information associated with the adjacent beams 512 and 514 at 626 and 636, and the decoding based on the combined LLRs at 637, the UE 502 may determine a post decoding reliability metric for each of the decodings at 626, 636 and 637. Each post decoding reliability metric may provide an indication/measure of how accurate the corresponding decoding of the broadcast information is, e.g., with a post decoding reliability metric having the largest value being the most accurate/reliable.

At 726, the apparatus may determine a refined receive beam direction based on the determined LLRs and based on whether the broadcast information associated with each of the subset of the received beams fails to decode or is successfully decoded. In the case being discussed where broadcast information associated with each of the at least two beams of the subset with adjacent receive beam directions is successfully decoded, the beam refinement operation at 726 may include determining the refined receive beam direction based on the determined reliability metrics. In some configurations, the beam refinement operation at 726 may include the performing one of the operations illustrated in boxes 728 or 730. In one configuration, at 728 the apparatus may determine the refined receive beam direction to be one of the receive beam directions of the at least two adjacent receive beam directions when the reliability metric for the decoded broadcast information associated with the one of the receive beam directions is a largest of the determined reliability metrics. For example, with reference to FIG. 6, continuing with the example case with two adjacent beams 512 and 514 and where the individual decodings at 626 and 636 as well as the decoding based on the combined LLRs at 637 are successful, the UE 508 may consider three corresponding post reliability metrics. When the post decoding reliability metric for the decoded broadcast information associated with the receive beam direction corresponding to the beam 512 is the largest of the three determined reliability metrics, the UE 508 may select the receive beam direction corresponding to the beam 512, e.g., east direction, as the refined beam direction. Similarly, when the post decoding reliability metric for the decoded broadcast information associated with the receive beam direction corresponding to the beam 514 is the largest of the three determined reliability metrics, the UE 508 may select the receive beam direction corresponding to the beam 512, e.g., south direction, as the refined beam direction.

In one configuration, at 730 the refined receive beam direction may be determined to be a combination of the receive beam directions of the two adjacent receive beam directions when the reliability metric for the broadcast information decoded based on the combined set of LLRs is a largest of the determined reliability metrics. For example, with reference to FIG. 6, if the individual decodings at 626 and 636, as well as the decoding based on the combined LLRs at 637 are successful, then the UE 502 may determine that the receive beam direction resulting from the combination of the receive beams directions corresponding to beams 512 and 514 may be taken as the refined receive beam direction. For example, when the post decoding reliability metric for the decoding (at 637) based on the combined LLRs is the largest, the UE 502 may select the south east direction as the refined receive beam direction. Having determined the refined receive beam direction, at 732 the apparatus may use the determined receive beam direction for performing further measurements and/or in subsequent operations, e.g., related to the initial cell search procedure and/or related to the RACH procedure.

Returning to the operation at 718, if at 718 it is determined that broadcast information associated with each of at least two beams of the subset with adjacent receive beam directions is not successfully decoded (e.g., PBCH decoding did not succeed for two or more adjacent beams), the operation proceeds to 734. Having determined that that broadcast information decoding did not succeed for at least two adjacent beams of the subset of received beams, at 734 the apparatus may determine that the broadcast information associated with one received beam, e.g., a first beam, of the subset of received beams is successfully decoded.

Having determined at 734 that that broadcast information decoding for a first beam of the subset of received beams is successfully decoded, next at 736 the apparatus may determine that the broadcast information associated with a second beam of the subset of the received beams, that is directionally adjacent to the first beam, fails to decode. Operation proceeds from 736 to 738 via connecting node B 737.

For the purposes of discussion, consider that the subset includes first and second beams (e.g., beams 512 and 514) with adjacent receive beam directions, and the broadcast information associated with the first beam (e.g., beam 512) is successfully decoded while the decoding fails for the broadcast information associated with the second beam (e.g., beam 514). At 738, the apparatus may generate a combined set of LLRs by combining the LLRs for the broadcast information associated with the first beam and the second beam. For example, with reference to FIG. 6, in the above discussed case, the UE 502 may generate (at 635) a combined set of LLRs by combining the first set of LLRs (e.g., for the coded bits of the broadcast information associated with the beam 512) and the second set of LLRs (e.g., for the coded bits of the broadcast information associated with the beam 514) as illustrated in FIG. 6.

At 740, the apparatus may decode the broadcast information based on the combined set of LLRs. For example, with reference to FIG. 6, the UE 502 may decode (at 637) the coded bits of the broadcast information based on the combined LLRs (e.g., output from the LLR combining stage 635). The UE 502 may then determine whether the decoding based on the combined LLRs is successful, e.g., by performing a CRC following the decoding based on the combined LLRs. At 742 the apparatus may determine a post decoding reliability metric corresponding to the successful decodings. For the purposes of discussion, further assuming that the PBCH decoding based on the combined LLRs is successful and because the PBCH decoding for the first beam is already determined to be successful, the apparatus may determine a post decoding reliability for decoded broadcast information associated with the first beam and for the broadcast information decoded based on the combined LLRs. For example, with reference to FIG. 6, considering decoding of the broadcast information associated with the first beam 512 at 626 and the decoding based on the combined LLRs at 637, the UE 502 may determine a post decoding reliability metric for each of the decodings at 626 and 637.

At 744, the apparatus may determine a refined receive beam direction based on the determined LLRs and based on whether the broadcast information associated with each of the subset of the received beams fails to decode or is successfully decoded. In the example case being discussed where broadcast information associated with one beam (e.g., first beam 512) of the subset is successfully decoded while the decoding fails for a directionally adjacent beam (e.g., second beam 514) of the subset, and where the broadcast information decoding based on the combined LLRs is successful, the beam refinement operation at 744 may include determining the refined receive beam direction based on the reliability metrics determined at 742. In some configurations, the beam refinement operation at 744 may include the performing one of the operations illustrated in boxes 746 or 748, e.g., depending on the post decoding reliability metrics.

In one configuration, at 746 the apparatus may determine the refined receive beam direction to be a receive beam direction of the first beam (e.g., east) when the reliability metric for the decoded broadcast information associated with the first beam is a largest of the determined reliability metrics. For example, with reference to FIG. 6, when the post decoding reliability metric for the decoded broadcast information associated with the receive beam direction corresponding to the beam 512 is the largest of the determined reliability metrics, the UE 508 may select the receive beam direction corresponding to the beam 512, e.g., east direction, as the refined beam direction. In one configuration, at 748 the refined receive beam direction may be determined to be a combination of the receive beam directions of the first beam and the second beam directions (e.g., receive directions of the first and second beams) when the reliability metric for the broadcast information decoded based on the combined set of LLRs is a largest of the determined reliability metrics. For example, with reference to FIG. 6, when the post decoding reliability metric for the decoding (at 637) based on the combined set of LLRs is the largest, the UE 502 may select the south east direction (which is a combination of the receive beam directions of the beams 512 and 514) as the refined receive beam direction. Having determined the refined receive beam direction, at 750 the apparatus may use the determined receive beam direction for performing further measurements and/or in subsequent operations, e.g., related to the initial cell search procedure and/or related to the RACH procedure.

While various aspects of an exemplary method are discussed with regard to flowchart 700, other variations are possible. Additionally, some of the features discussed above may be desirable in some configurations but may not necessarily be needed.

Figure 8:
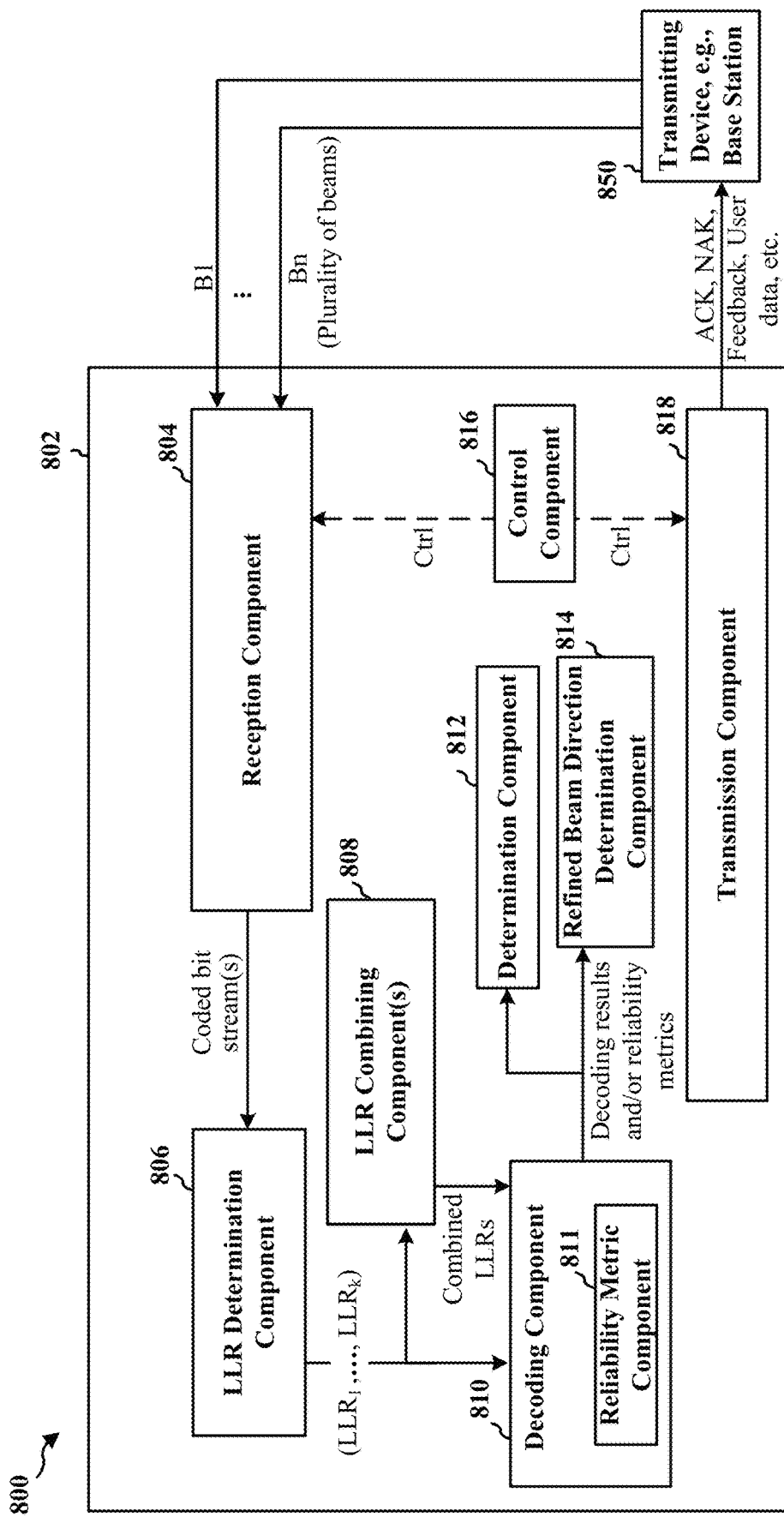
FIG. 8 is a conceptual data flow diagram illustrating the data flow between different means/components in an exemplary apparatus.

FIG. 8 is a conceptual data flow diagram 800 illustrating the data flow between different means/components in an exemplary apparatus 802. The apparatus 802 may be used as any of the UEs, e.g., UE 104/404/502. The apparatus 802 may include a reception component 804, an LLR determination component 806, an LLR combining component 808, a decoding component (including one or more decoders) 810, a determination component 812, a refined beam direction determination component 814, a control component 816, and a transmission component 818.

The reception component 804 may be configured to receive and process signals and/or information from other devices such as the base station 850. The reception component 804 may be configured to receive a plurality of beams through a plurality of different receive beam directions, each of the beams including broadcast information on a PBCH. The received signals and/or information communicated via the plurality of beams may also include PSS, SSS and/or other signals as discussed in detail with respect to one or more preceding figures.

The LLR determination component 806 may be configured to determine, for each received beam of a subset of the received beams, LLRs for coded bits of the broadcast information. For each beam of the subset of received beams, the LLRs for the coded bits of the broadcast information may be determined on a per bit basis, e.g., using the coded bit stream of the broadcast information for which the LLRs are being generated. Thus the LLR for multiple coded bits of broadcast information associated with a given beam may include determined LLR values corresponding to the multiple coded bits. For example, the LLR determination component 806 may be configured to determine a first set of LLRs for the coded bits of the broadcast information (e.g., including LLRs for multiple coded bits) associated with a first received beam of the subset of received beams and second set of LLRs for coded bits of the broadcast information associated with a second received beam of the subset of received beams. In some configurations, the LLR determination component 806 may include multiple LLR determination components, e.g., for concurrently determining LLRs for coded broadcast information from multiple different received beams of the subset of received beams. The determined LLRs (e.g., first and second set of LLRs) may be provided as input to the decoding component 810 and the LLR combining component 808 in some configurations.

The LLR combining component 808 may be configured to generate a combined set of LLRs in accordance with various aspects of the disclosure, e.g., by combining the LLRs for the broadcast information associated with two directionally adjacent receive beams (e.g., two beams with adjacent receive beam directions such as beam 510 and 512, or 512 and 514 in FIG. 5). For example, with reference to FIG. 6, a combined set of LLRs may be generated at 635 by combining the LLRs for the broadcast information associated with the two directionally adjacent receive beams 512 and 514. In some configurations, the LLR combining component 808 may be further configured to provide the combined set of LLRs as an input to the decoding component 810.

The decoding component 810 may include one or more decoders and may be configured to decode the broadcast information associated with each received beam of the subset of received beams as discussed in detail with respect to FIG. 6 and the flowchart of FIG. 7. In some configurations the decoding component 810 may be configured to decode the broadcast information associated with each received beam of the subset of received beams based on the corresponding LLRs provided by the LLR determination component 806. For example, with reference to FIG. 6, assuming the subset of received beams being decoded includes at least a first and second beam 512 and 514, the decoding component 810 may decode (e.g., at 626) the broadcast information associated with beam 512 based on generated LLRs (e.g., first set of LLRs) for the broadcast information associated with the first beam 512 and may decode (e.g., at 636) the broadcast information associated with beam 514 based on generated LLRs (e.g., second set of LLRs) for the broadcast information associated with the second beam 514. In some configurations, the decoding component 810 may be configured to decode the broadcast information based on a combined set of LLRs provided by the LLR combining component 808 as discussed in detail with respect to respect to FIG. 6 and the flowchart of FIG. 7.

In some configurations, the decoding component 810 alone or in collaboration with the control component 816 may perform cyclic redundancy check of each decoding performed by the decoding component 810 to check whether the decoding succeeded or failed. In some configurations, the decoding component 810 may provide the result of decoding to the determination component 812. The determination component 812 may be configured to determine whether the broadcast information associated with each received beam of the subset of received beams failed to decode or successfully decoded, e.g., based on decoding results for one or more decodings received from the decoding component 810. Thus, based on the decoding results, in some configurations, the determination component 812 may determine that the broadcast information associated with each received beam of the subset of received beams failed to decode. In one configuration, the determination component 812 may determine that the broadcast information associated with each of at least two received beams with adjacent receive beam directions of the subset of received beams is successfully decoded. In one configuration, the determination component 812 may determine that the broadcast information associated with one beam (e.g., a first beam) of the subset of the received beams is successfully decoded while broadcast information associated with a second received beam of the subset of received beams, which is directionally adjacent the first beam, failed to decode.

In some configurations, the decoding component 810 may include a reliability metric component 811 configured to determine a reliability metric for each decoding or alternatively for each successful decoding performed by the decoding component 810. For example, in one configuration the subset of received beams may include at least two adjacent beams for which the broadcast information successfully decodes and decoding of the broadcast information based on a combined set of LLRs (generated by combining the LLRs for the coded bits of the broadcast information associated with the at least two adjacent beams) also succeeds. In this case, the reliability metric component 811 may determine a post decoding reliability metric for each of the decoded broadcast information associated with each of the at least two adjacent receive beam directions and for the broadcast information decoded based on the combined set of LLRs. In another example, the broadcast information associated with a first beam of the subset of received beams may be successfully decoded while broadcast information associated with a second beam of the subset of received beams, which is directionally adjacent the first beam, may fail decoding. Furthermore, in the example, a decoding of the broadcast information based on a combined set of LLRs (generated by combining the LLRs for the broadcast information associated with the first beam and the second beam) may also be successful. In such an example case, the reliability metric component 811 may determine a post decoding reliability metric for decoded broadcast information associated with the first beam and for the broadcast information decoded based on a combined LLRs. As discussed supra in detail with respect to FIGS. 6-7, in some configurations, a refined receive beam direction may be determined based on the determined post decoding reliability metrics.

The refined beam direction determination component 814 may be configured to determine a refined receive beam direction based on the determined LLRs and based on whether the broadcast information associated with each received beam of the subset of received beams fails to decode or is successfully decoded. As discussed in detail with respect to FIGS. 6-7, depending on the given case and based on the result of PBCH decoding for each received beam of the subset of received beams, the refined beam direction determination component 814 may determine the refined receive beam direction in a variety of ways. For example, the refined beam direction determination component 814 may perform beam refinement to determine the refined beam direction in the manner discussed with respect to the operations at 714 and 715, or in the manner discussed with respect to the operations at 726, 728 and 730, or in the manner discussed with respect to the operations at 744, 746 and 748. For example, in configuration, the refined beam direction determination component 814 may be configured to determine the refined receive beam direction based on the two adjacent receive beam directions when the broadcast information based on the combined set of LLRs is successfully decoded.

In one configuration, the refined beam direction determination component 814 may be configured to determine the refined receive beam direction based on determined reliability metrics (determined by the reliability metric component 811). For example, in one configuration, where the broadcast information associated with each of at least two beams with adjacent receive beam directions of the subset of the received beams is successfully decoded, the refined beam direction determination component 814 may be configured to determine the refined receive beam direction to be one of the receive beam directions of the at least two adjacent receive beam directions when a reliability metric for the decoded broadcast information associated with the one of the receive beam directions is a largest of the determined reliability metrics. In one configuration, the refined beam direction determination component 814 may be configured to determine the refined receive beam direction to be a combination of the receive beam directions of the two adjacent receive beam directions when the reliability metric for the broadcast information decoded based on the combined set of LLRs is a largest of the determined reliability metrics.

In one configuration, the refined beam direction determination component 814 may be configured to determine the refined receive beam direction to be a receive beam direction of a first beam when the reliability metric for the decoded broadcast information associated with the first beam is a largest of the determined reliability metrics. In one configuration, the refined beam direction determination component 814 may be configured to determine the refined receive beam direction to be a combination of receive beam directions of the first beam and a second beam when the reliability metric for the broadcast information decoded based on the combined set of LLRs is a largest of the determined reliability metrics.

The control component 816 may be configured to provide transmission/reception timing information to the transmission and reception components 818 and 804, respectively, to control transmission and reception of data and/or control information. The control component 816 may be further configured to control one or more other components of the apparatus 802 to implement various functions and/or perform operation in accordance with the method of flowchart 700. In some configurations, the control component 816 may be further configured to control the apparatus 802 and/or one or more component therein to use the determined receive beam direction (determined by component 814) for performing further measurements and/or in subsequent operations, e.g., related to the initial cell search procedure and/or related to the RACH procedure.

The transmission component 818 may be configured to transmit information, e.g., ACKs, NAKs, beacons, user data and/or control signals, to the base station 850 and/or other UEs.

The apparatus may include additional components that perform each of the blocks of the algorithm in the aforementioned flowchart of FIG. 7. As such, each block in the aforementioned flowchart of FIG. 7 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 9:
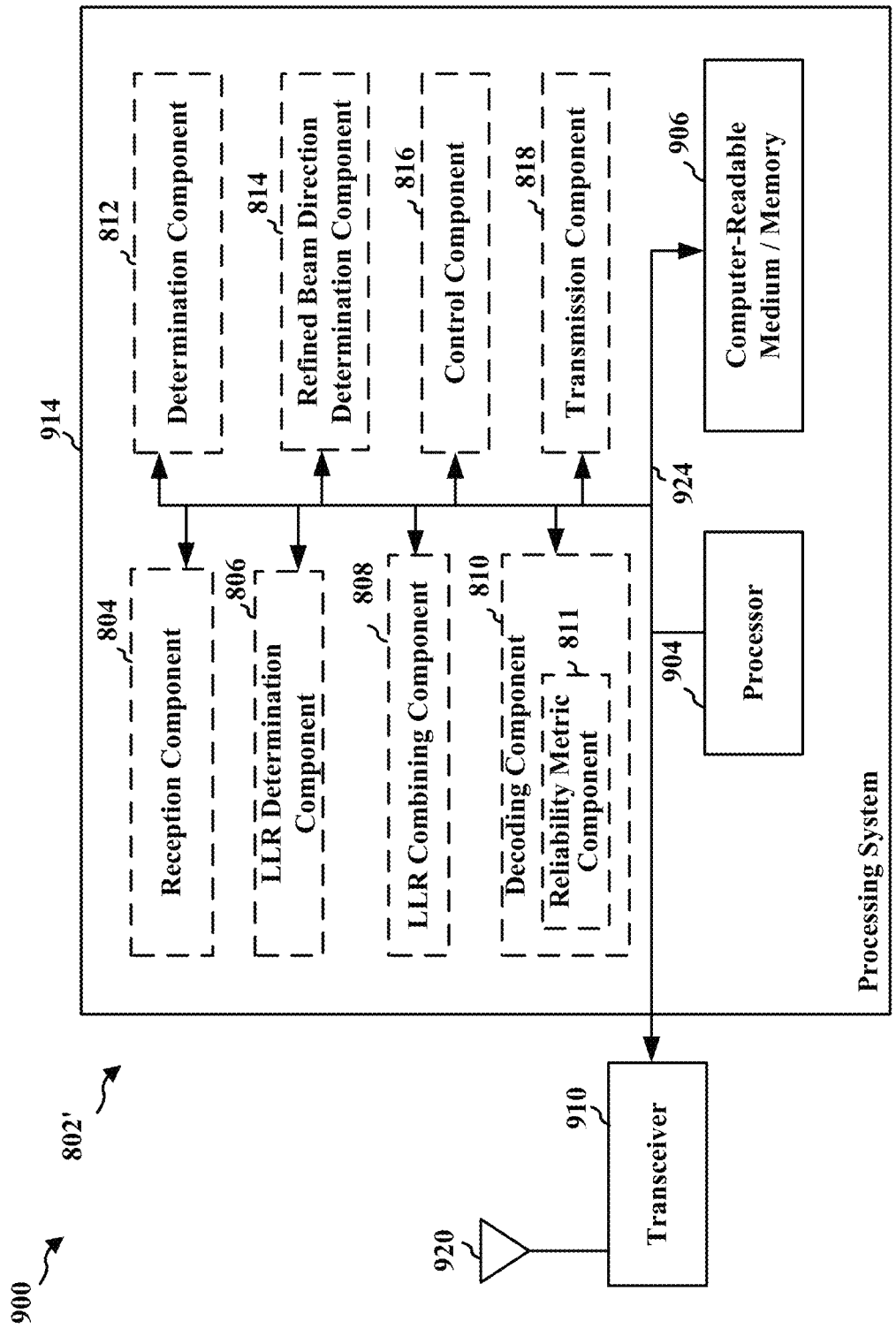
FIG. 9 is a diagram illustrating an example of a hardware implementation for an apparatus employing a processing system.

FIG. 9 is a diagram 900 illustrating an example of a hardware implementation for an apparatus 802' employing a processing system 914. The processing system 914 may be implemented with a bus architecture, represented generally by the bus 924. The bus 924 may include any number of interconnecting buses and bridges depending on the specific application of the processing system 914 and the overall design constraints. The bus 924 links together various circuits including one or more processors and/or hardware components, represented by the processor 904, the components 804, 806, 808, 810, 811, 812, 814, 816, 818, and the computer-readable medium/memory 906. The bus 924 may also link various other circuits such as timing sources, peripherals, voltage regulators, and power management circuits, which are well known in the art, and therefore, will not be described any further.

The processing system 914 may be coupled to a transceiver 910. The transceiver 910 may include individual transmitter and receiver circuits in some configurations. The transceiver 910 may be coupled to one or more antennas 920. The transceiver 910 provides a means for communicating with various other apparatus over a transmission medium. The transceiver 910 receives a signal from the one or more antennas 920, extracts information from the received signal, and provides the extracted information to the processing system 914, specifically the reception component 804. In addition, the transceiver 910 receives information from the processing system 914, specifically the transmission component 818, and based on the received information, generates a signal to be applied to the one or more antennas 920. The processing system 914 includes a processor 904 coupled to a computer-readable medium/memory 906. The processor 904 is responsible for general processing, including the execution of software stored on the computer-readable medium/memory 906. The software, when executed by the processor 904, causes the processing system 914 to perform the various functions described supra for any particular apparatus. The computer-readable medium/memory 906 may also be used for storing data that is manipulated by the processor 904 when executing software. The processing system 914 further includes at least one of the components 804, 806, 808, 810, 811, 812, 814, 816, and 818. The components may be software components running in the processor 904, resident/stored in the computer-readable medium/memory 906, one or more hardware components coupled to the processor 904, or some combination thereof.

In one configuration, the apparatus 802/802' for wireless communication includes means for receiving a plurality of beams through a plurality of different receive beam directions, each of the beams including broadcast information on a PBCH. The apparatus 802/802' may further include means for determining, for each of a subset of the received beams, LLRs for coded bits of the broadcast information. The apparatus 802/802' may further include means for decoding the broadcast information associated with each of the subset of the received beams, and means for determining a refined receive beam direction based on the determined LLRs and based on whether the broadcast information associated with each of the subset of the received beams fails to decode or is successfully decoded. In some configurations, the apparatus 802/802' may further include means for determining that the broadcast information associated with each of the subset of the received beams failed to decode. In some configurations, the apparatus 802/802' may further include means for generating a combined set of LLRs by combining the LLRs for the broadcast information associated with two adjacent receive beam directions. In some such configurations, the means for decoding may be further configured to decode the broadcast information based on the combined set of LLRs. In some configurations, the means for determining the refined receive beam direction is configured to determine the refined receive beam direction based on the two adjacent receive beam directions when the broadcast information based on the combined set of LLRs is successfully decoded.

In some configurations, the apparatus 802/802' may include means for determining that the broadcast information associated with each of at least two beams with adjacent receive beam directions of the subset of the received beams is successfully decoded. In some configurations, the apparatus 802/802' may further include means for generating a combined set of LLRs by combining the LLRs for the broadcast information associated with the at least two adjacent receive beam directions. In some such configurations, the means for decoding is further configured to decode the broadcast information based on the combined set of LLRs. In some configurations, the apparatus 802/802' may further include means for determining a reliability metric for each of the decoded broadcast information associated with each of the at least two adjacent receive beam directions and for the broadcast information decoded based on the combined set of LLRs. In some such configurations, the means for determining the refined receive beam direction is configured to determine the refined receive beam direction based on the determined reliability metrics. In some configurations, the refined receive beam direction is determined to be one of the receive beam directions of the at least two adjacent receive beam directions when the reliability metric for the decoded broadcast information associated with the one of the receive beam directions is a largest of the determined reliability metrics. In some configurations, the refined receive beam direction is determined to be a combination of the receive beam directions of the two adjacent receive beam directions when the reliability metric for the broadcast information decoded based on the combined set of LLRs is a largest of the determined reliability metrics.

In some configurations, the apparatus 802/802' may further include means for determining that the broadcast information associated with a first beam of the subset of the received beams is successfully decoded. In some such configurations, the apparatus 802/802' may further include means for determining that the broadcast information associated with a second beam of the subset of the received beams fails to decode, the first and second beams being directionally adjacent. In some such configurations, the apparatus 802/802' may further include means for generating a combined set of LLRs by combining the LLRs for the broadcast information associated with the first beam and the second beam. In some such configurations, the means for decoding is further configured to decode the broadcast information based on the combined set of LLRs. In some configurations, the apparatus 802/802' may further include means for determining a reliability metric for decoded broadcast information associated with the first beam and for the broadcast information decoded based on the combined set of LLRs. In some such configurations, the means for determining the refined receive beam direction is configured to determine the refined receive beam direction based on the determined reliability metrics. In some such configurations, the refined receive beam direction is determined to be a receive beam direction of the first beam when the reliability metric for the decoded broadcast information associated with the first beam is a largest of the determined reliability metrics. In some configurations, the refined receive beam direction is determined to be a combination of the receive beam directions of the first beam and the second beam when the reliability metric for the broadcast information decoded based on the combined LLRs is a largest of the determined reliability metrics.

The aforementioned means may be one or more of the aforementioned components of the apparatus 802 and/or the processing system 914 of the apparatus 802' configured to perform the functions recited by the aforementioned means. In some embodiments the processing system 914 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication, comprising:
   receiving a plurality of beams through a plurality of different receive beam directions, each of the received beams including broadcast information on a physical broadcast channel (PBCH) and synchronization information;
   determining, for each of a subset of the received beams, log likelihood ratios (LLRs) for coded bits of the broadcast information, wherein the subset of the received beams including the broadcast information is determined based on the synchronization information;
   decoding the broadcast information associated with each of the subset of the received beams; and determining a refined receive beam direction based on:
the determined LLRs,
whether the broadcast information associated with each of the subset of the received beams fails to decode or is successfully decoded, and
a determined reliability metric for each of the decoded broadcast information.

2. The method of claim 1, further comprising:
determining that the broadcast information associated with each of the subset of the received beams failed to decode;
generating a combined set of LLRs by combining the LLRs for the broadcast information associated with two adjacent receive beam directions; and
decoding the broadcast information based on the combined set of LLRs.

3. The method of claim 2, wherein the refined receive beam direction is determined based on the two adjacent receive beam directions when the broadcast information based on the combined set of LLRs is successfully decoded.

4. The method of claim 1, further comprising:
determining that the broadcast information associated with each of at least two beams with adjacent receive beam directions of the subset of the received beams is successfully decoded;
generating a combined set of LLRs by combining the LLRs for the broadcast information associated with the at least two adjacent receive beam directions;
decoding the broadcast information based on the combined set of LLRs; and
determining a reliability metric for each of the decoded broadcast information associated with each of the at least two adjacent receive beam directions and for the broadcast information decoded based on the combined set of LLRs.

5. The method of claim 4, wherein the refined receive beam direction is determined to be one of the receive beam directions of the at least two adjacent receive beam directions when the reliability metric for the decoded broadcast information associated with the one of the receive beam directions is a largest of the determined reliability metrics.

6. The method of claim 4, wherein the refined receive beam direction is determined to be a combination of the receive beam directions of the two adjacent receive beam directions when the reliability metric for the broadcast information decoded based on the combined set of LLRs is a largest of the determined reliability metrics.

7. The method of claim 1, further comprising:
determining that the broadcast information associated with a first beam of the subset of the received beams is successfully decoded;
determining that the broadcast information associated with a second beam of the subset of the received beams fails to decode, the first and second beams being directionally adjacent;
generating a combined set of LLRs by combining the LLRs for the broadcast information associated with the first beam and the second beam;
decoding the broadcast information based on the combined set of LLRs; and
determining a reliability metric for the decoded broadcast information associated with the first beam and for the broadcast information decoded based on the combined set of LLRs.

8. The method of claim 7, wherein the refined receive beam direction is determined to be a receive beam direction of the first beam when the reliability metric for the decoded broadcast information associated with the first beam is a largest of the determined reliability metrics.

9. The method of claim 7, wherein the refined receive beam direction is determined to be a combination of receive beam directions of the first beam and the second beam when the reliability metric for the broadcast information decoded based on the combined set of LLRs is a largest of the determined reliability metrics.

10. An apparatus for wireless communication, comprising:
means for receiving a plurality of beams through a plurality of different receive beam directions, each of the received beams including broadcast information on a physical broadcast channel (PBCH) and synchronization information;
means for determining, for each of a subset of the received beams, a log likelihood ratios (LLRs) for coded bits of the broadcast information, wherein the subset of the received beams including the broadcast information is determined based on the synchronization information;
means for decoding the broadcast information associated with each of the subset of the received beams; and
means for determining a refined receive beam direction based on:
the determined LLRs,
whether the broadcast information associated with each of the subset of the received beams fails to decode or is successfully decoded, and
a determined reliability metric for each of the decoded broadcast information.

11. The apparatus of claim 10, further comprising:
means for determining that the broadcast information associated with each of the subset of the received beams failed to decode;
means for generating a combined set of LLRs by combining the LLRs for the broadcast information associated with two adjacent receive beam directions; and
wherein the means for decoding is further configured to decode the broadcast information based on the combined set of LLRs.

12. The apparatus of claim 11, wherein the means for determining the refined receive beam direction is configured to determine the refined receive beam direction based on the two adjacent receive beam directions when the broadcast information based on the combined set of LLRs is successfully decoded.

13. The apparatus of claim 10, further comprising:
means for determining that the broadcast information associated with each of at least two beams with adjacent receive beam directions of the subset of the received beams is successfully decoded;
means for generating a combined set of LLRs by combining the LLRs for the broadcast information associated with the at least two adjacent receive beam directions;
wherein the means for decoding is further configured to decode the broadcast information based on the combined set of LLRs; and
means for determining a reliability metric for each of the decoded broadcast information associated with each of the at least two adjacent receive beam directions and for the broadcast information decoded based on the combined set of LLRs.

14. The apparatus of claim 13, wherein the refined receive beam direction is determined to be one of the receive beam directions of the at least two adjacent receive beam directions when the reliability metric for the decoded broadcast information associated with the one of the receive beam directions is a largest of the determined reliability metrics.

15. The apparatus of claim 13, wherein the refined receive beam direction is determined to be a combination of the receive beam directions of the two adjacent receive beam directions when the reliability metric for the broadcast information decoded based on the combined set of LLRs is a largest of the determined reliability metrics.

16. The apparatus of claim 10, further comprising:
   means for determining that the broadcast information associated with a first beam of the subset of the received beams is successfully decoded;
   means for determining that the broadcast information associated with a second beam of the subset of the received beams fails to decode, the first and second beams being directionally adjacent;
   means for generating a combined set of LLRs by combining the LLRs for the broadcast information associated with the first beam and the second beam;
   wherein the means for decoding is further configured to decode the broadcast information based on the combined set of LLRs; and
   means for determining a reliability metric for the decoded broadcast information associated with the first beam and for the broadcast information decoded based on the combined set of LLRs.

17. The apparatus of claim 16, wherein the refined receive beam direction is determined to be a receive beam direction of the first beam when the reliability metric for the decoded broadcast information associated with the first beam is a largest of the determined reliability metrics.

18. The apparatus of claim 16, wherein the refined receive beam direction is determined to be a combination of receive beam directions of the first beam and the second beam when the reliability metric for the broadcast information decoded based on the combined set of LLRs is a largest of the determined reliability metrics.

19. An apparatus for wireless communication, comprising:
   a memory; and
   at least one processor coupled to the memory and configured to:
      receive a plurality of beams through a plurality of different receive beam directions, each of the received beams including broadcast information on a physical broadcast channel (PBCH) and synchronization information;
      determine, for each of a subset of the received beams, a log likelihood ratios (LLRs) for coded bits of the broadcast information, wherein the subset of the received beams including the broadcast information is determined based on the synchronization information;
      decode the broadcast information associated with each of the subset of the received beams; and
      determine a refined receive beam direction based on:
         the determined LLRs,
         whether the broadcast information associated with each of the subset of the received beams fails to decode or is successfully decoded, and
         a determined reliability metric for each of the decoded broadcast information.

20. The apparatus of claim 19, wherein the at least one processor is further configured to:
      determine that the broadcast information associated with each of the subset of the received beams failed to decode;
      generate a combined set of LLRs by combining the LLRs for the broadcast information associated with two adjacent receive beam directions; and
      decode the broadcast information based on the combined set of LLRs.

21. The apparatus of claim 20, wherein the at least one processor is further configured to determine the refined receive beam direction based on the two adjacent receive beam directions when the broadcast information based on the combined set of LLRs is successfully decoded.

22. The apparatus of claim 19, wherein the at least one processor is further configured to:
   determine that the broadcast information associated with each of at least two beams with adjacent receive beam directions of the subset of the received beams is successfully decoded;
   generate a combined set of LLRs by combining the LLRs for the broadcast information associated with the at least two adjacent receive beam directions;
   decode the broadcast information based on the combined set of LLRs; and
   determine a reliability metric for each of the decoded broadcast information associated with each of the at least two adjacent receive beam directions and for the broadcast information decoded based on the combined set of LLRs.

23. The apparatus of claim 22, wherein the refined receive beam direction is determined to be one of the receive beam directions of the at least two adjacent receive beam directions when the reliability metric for the decoded broadcast information associated with the one of the receive beam directions is a largest of the determined reliability metrics.

24. The apparatus of claim 22, wherein the refined receive beam direction is determined to be a combination of the receive beam directions of the two adjacent receive beam directions when the reliability metric for the broadcast information decoded based on the combined set of LLRs is a largest of the determined reliability metrics.

25. The apparatus of claim 19, wherein the at least one processor is further configured to:
   determine that the broadcast information associated with a first beam of the subset of the received beams is successfully decoded;
   determine that the broadcast information associated with a second beam of the subset of the received beams fails to decode, the first and second beams being directionally adjacent;
   generate a combined set of LLRs by combining the LLRs for the broadcast information associated with the first beam and the second beam;
   decode the broadcast information based on the combined set of LLRs; and
   determine a reliability metric for the decoded broadcast information associated with the first beam and for the broadcast information decoded based on the combined set of LLRs.

26. The apparatus of claim 25, wherein the refined receive beam direction is determined to be a receive beam direction of the first beam when the reliability metric for the decoded broadcast information associated with the first beam is a largest of the determined reliability metrics.

27. The apparatus of claim 25, wherein the refined receive beam direction is determined to be a combination of receive beam directions of the first beam and the second beam when the reliability metric for the broadcast information decoded based on the combined set of LLRs is a largest of the determined reliability metrics.

28. The apparatus of claim 19, wherein the apparatus is a user equipment (UE).

29. A non-transitory computer readable medium of a user equipment (UE) storing computer executable code, comprising code to:
- receive a plurality of beams through a plurality of different receive beam directions, each of the received beams including broadcast information on a physical broadcast channel (PBCH) and synchronization information;
- determine, for each of a subset of the received beams, a log likelihood ratios (LLRs) for coded bits of the broadcast information, wherein the subset of the received beams including the broadcast information is determined based on the synchronization information;
- decode the broadcast information associated with each of the subset of the received beams; and
- determine a refined receive beam direction based on:
  - the determined LLRs,
  - whether the broadcast information associated with each of the subset of the received beams fails to decode or is successfully decoded, and
  - a determined reliability metric for each of the decoded broadcast information.

* * * * *